US011765476B2

(12) United States Patent
Nishi et al.

(10) Patent No.: US 11,765,476 B2
(45) Date of Patent: *Sep. 19, 2023

(54) IMAGING ELEMENT AND METHOD FOR MANUFACTURING IMAGING ELEMENT

(71) Applicant: SONY SEMICONDUCTOR SOLUTIONS CORPORATION, Kanagawa (JP)

(72) Inventors: Sachio Nishi, Kumamoto (JP); Hironobu Fukagawa, Kumamoto (JP); Hideaki Kato, Kumamoto (JP); Akimitsu Sato, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/943,052

(22) Filed: Sep. 12, 2022

(65) Prior Publication Data

US 2023/0007199 A1 Jan. 5, 2023

Related U.S. Application Data

(63) Continuation of application No. 17/250,307, filed as application No. PCT/JP2019/023301 on Jun. 12, 2019, now Pat. No. 11,477,403.

(30) Foreign Application Priority Data

Jul. 9, 2018 (JP) .................................. 2018-129652

(51) Int. Cl.
*H04N 25/704* (2023.01)
*H01L 27/146* (2006.01)

(52) U.S. Cl.
CPC ......... *H04N 25/704* (2023.01); *H01L 27/146* (2013.01)

(58) Field of Classification Search
CPC .... H04N 5/36961; H04N 25/704; G02B 5/30; G02B 7/34; G03B 13/16;
(Continued)

(56) References Cited

U.S. PATENT DOCUMENTS 11,477,403 B2 * 10/2022 Nishi ................ H01L 27/14627
2005/0035377 A1    2/2005 Kamimura et al.
2017/0366770 A1 * 12/2017 Yokogawa ........ H01L 27/14627

FOREIGN PATENT DOCUMENTS

CN         104969540 A    10/2015
CN         107004685 A     8/2017
(Continued)

OTHER PUBLICATIONS

International Search Report and Written Opinion of PCT Application No. PCT/JP2019/023301, dated Aug. 13, 2019, 14 pages of English Translation and 10 pages of ISRWO.
(Continued)

*Primary Examiner* — Nicholas G Giles
(74) *Attorney, Agent, or Firm* — CHIP LAW GROUP

(57) ABSTRACT

A step of forming an on-chip lens of a phase difference pixel is simplified. An imaging element includes a pixel array unit, an individual on-chip lens, a common on-chip lens, and an adjacent on-chip lens. In the pixel array unit, pixels that performs photoelectric conversion according to incident light components, a plurality of phase difference pixels that is included in the pixels, is arranged adjacent to each other, and detects a phase difference, and phase difference pixel adjacent pixels that are included in the pixels and are adjacent to the phase difference pixels are arranged two-dimensionally. The individual on-chip lens is arranged for each of the pixels and individually condenses the incident light components on corresponding one of the pixels. The common on-chip lens is commonly arranged in the plurality of phase difference pixels and commonly condenses the incident light component. The adjacent on-chip lens is arranged for each of the phase difference pixel adjacent pixels, individually condenses the incident light components on corresponding one of the phase difference pixel adjacent
(Continued)

pixels, and is formed to have a size different from the individual on-chip lens to adjust a shape of the common on-chip lens.

14 Claims, 18 Drawing Sheets

(58) Field of Classification Search
CPC ......... H01L 27/14605; H01L 27/14621; H01L 27/14623; H01L 27/14645; H01L 27/14627; H01L 27/14685; H01L 27/1463; H01L 27/146
See application file for complete search history.

(56) References Cited

FOREIGN PATENT DOCUMENTS

| | | | |
|---|---|---|---|
| EP | 3236500 | A1 | 10/2017 |
| EP | 3483937 | A1 | 5/2019 |
| JP | 2000-349268 | A | 12/2000 |
| JP | 2016-001682 | A | 1/2016 |
| JP | 2016-029674 | A | 3/2016 |
| KR | 10-2009-0122718 | A | 12/2009 |
| WO | 2014/097884 | A1 | 6/2014 |
| WO | 2016/098640 | A1 | 6/2016 |
| WO | WO-2016098640 | A1 * | 6/2016 ............... G02B 7/34 |
| WO | 2018/008408 | A1 | 1/2018 |

OTHER PUBLICATIONS

Notice of Allowance for U.S. Appl. No. 17/250,307, dated Jun. 10, 2022, 10 pages.
Non-Final Office Action for U.S. Appl. No. 17/250,307, dated Mar. 4, 2022, 13 pages.
International Preliminary Report on Patentability of PCT Application No. PCT/JP2019/023301, dated Jan. 21, 2021, 14 pages of English Translation and 07 pages of IPRP.
Office Action for CN Application No. 202211460563.X, dated Jul. 5, 2023, 05 pages of Office Action.

* cited by examiner

IMAGING ELEMENT AND METHOD FOR MANUFACTURING IMAGING ELEMENT

CROSS REFERENCE TO RELATED APPLICATIONS

This application is a continuation application of U.S. patent application Ser. No. 17/250,307, filed on Dec. 31, 2020, is a U.S. National Phase of International Patent Application No. PCT/JP2019/023301 filed on Jun. 12, 2019, which claims priority benefit of Japanese Patent Application No. JP 2018-129652 filed in the Japan Patent Office on Jul. 9, 2018. Each of the above-referenced applications is hereby incorporated herein by reference in its entirety.

TECHNICAL FIELD

The present disclosure relates to an imaging element and a method for manufacturing the imaging element. More specifically, the present disclosure relates to an imaging element that detects an image plane phase difference and a method for manufacturing the imaging element.

BACKGROUND ART

Conventionally, an imaging element that performs autofocus has been used. For example, an imaging element is used that performs autofocus by arranging phase difference pixels that detect an image plane phase difference to detect a focal position of a subject, and adjusting a position of an imaging lens according to the detected focal position. At this time, the phase difference pixels include a pair of pixels. Light components transmitted through different positions of the imaging lens, for example, a right side and a left side of the imaging lens, are each incident on the pair of phase difference pixels to perform imaging, and an image signal is generated for each phase difference pixel. A phase difference of an image based on each of the generated image signals is detected, so that the focal position can be detected. A method of dividing the light component transmitted through the imaging lens into two in this way is called pupil division.

As such an imaging element, an imaging element is used in which an on-chip lens common to two adjacent pixels is arranged to form phase difference pixels, so that the pupil division is performed. By condensing light components from a subject on the two pixels through the commonly arranged on-chip lens, it is possible to apply, to these pixels, light components transmitted through different positions of an imaging lens. For example, an imaging element has been proposed in which a first microlens and a film covering the first microlens are formed for each pixel, and a second microlens is formed on a surface of a film of a focus detection pixel (see, for example, Patent Document 1). In this conventional technology, the microlenses and the focus detection pixel correspond to the on-chip lens and the phase difference pixel, respectively. Furthermore, the film on a surface of the first microlens is used as an etching stopper when the second microlens is formed by etching.

CITATION LIST

Patent Document

Patent Document 1: Japanese Patent Application Laid-Open No. 2016-001682

SUMMARY OF THE INVENTION

Problems to be Solved by the Invention

In the above-described conventional technology, a condensing point is adjusted in order to improve autofocus performance of the focus detection pixel. To perform the adjustment of the condensing point, the on-chip lens and the film are formed on the phase difference pixel, and then a second on-chip lens that commonly covers on-chip lenses of two phase difference pixels is formed. As described above, in the above-described conventional technology, there is a problem that since the on-chip lenses of the phase difference pixels are formed by two steps of forming the on-chip lens, the steps of forming the on-chip lens are complicated.

The present disclosure has been made in view of the above-described problem, and an object of the present disclosure is to simplify a step of forming an on-chip lens of a phase difference pixel.

Solutions to Problems

The present disclosure has been made to solve the above-described problem, and a first aspect thereof is an imaging element including a pixel array unit in which pixels that perform photoelectric conversion according to incident light components, a plurality of phase difference pixels that is included in the pixels, is arranged adjacent to each other, and detects a phase difference, and phase difference pixel adjacent pixels that are included in the pixels and are adjacent to the phase difference pixels are arranged two-dimensionally, an individual on-chip lens that is arranged for each of the pixels and individually condenses the incident light components on corresponding one of the pixels, a common on-chip lens that is commonly arranged in the plurality of phase difference pixels and commonly condenses the incident light components, and an adjacent on-chip lens that is arranged for each of the phase difference pixel adjacent pixels, individually condenses the incident light components on corresponding one of the phase difference pixel adjacent pixels, and is formed to have a size different from the individual on-chip lens to adjust a shape of the common on-chip lens.

Furthermore, in this first aspect, the adjacent on-chip lens may be formed to have a size larger than the individual on-chip lens.

Furthermore, in this first aspect, the adjacent on-chip lens may be formed to have a bottom portion with a width larger than the individual on-chip lens.

Furthermore, in this first aspect, an adjacent on-chip lens adjacent to the common on-chip lens at an apex may be formed to have a size larger than an adjacent on-chip lens adjacent to the common on-chip lens on a side.

Furthermore, in the first aspect, the individual on-chip lens may be arranged so that a position relative to corresponding one of the pixels is shifted according to an incident angle of the incident light components, the adjacent on-chip lens may be arranged so that a position relative to corresponding one of the phase difference pixel adjacent pixels is shifted according to the incident angle of the incident light components, and the common on-chip lens may be arranged so that a position relative to the phase difference pixels is shifted according to the incident angle of the incident light components.

Furthermore, in the first aspect, among peripheral adjacent on-chip lenses that are adjacent on-chip lenses adjacent to a peripheral common on-chip lens which is a common on-chip lens arranged in a periphery of the pixel array unit, a peripheral adjacent on-chip lens close to an optical center of the pixel array unit and a peripheral adjacent on-chip lens close to an end portion of the pixel array unit may be formed to have different sizes.

Furthermore, in the first aspect, among the peripheral adjacent on-chip lenses, the peripheral adjacent on-chip lens close to the optical center of the pixel array unit may be formed to have a size smaller than the peripheral adjacent on-chip lens close to the end portion of the pixel array unit, which is arranged symmetrically with respect to the peripheral common on-chip lens.

Furthermore, in the first aspect, a peripheral close-adjacent on-chip lens that is a peripheral adjacent on-chip lens arranged between the peripheral common on-chip lens and the optical center of the pixel array unit may be formed to have a size smaller than a peripheral far-adjacent on-chip lens that is a peripheral adjacent on-chip lens arranged symmetrically with respect to the peripheral common on-chip lens.

Furthermore, in this first aspect, the peripheral close-adjacent on-chip lens may be formed to have a size smaller than an individual on-chip lens adjacent to the peripheral close-adjacent on-chip lens.

Furthermore, in this first aspect, the peripheral far-adjacent on-chip lens may be formed to have a size larger than an individual on-chip lens adjacent to the peripheral far-adjacent on-chip lens.

Furthermore, in this first aspect, the adjacent on-chip lens may be formed at different heights between a bottom portion of a region adjacent to the common on-chip lens and a bottom portion of a region adjacent to the individual on-chip lens.

Furthermore, in the first aspect, a shape of a bottom surface of the adjacent on-chip lens may be formed as a shape different from a bottom surface of the phase difference pixel adjacent pixels.

Furthermore, in this first aspect, the common on-chip lens may commonly condense the incident light components on two of the phase difference pixels.

Furthermore, in this first aspect, the common on-chip lens may commonly condense the incident light components on four of the phase difference pixels.

Furthermore, in this first aspect, the plurality of phase difference pixels may perform pupil division on the incident light components to detect the phase difference.

Furthermore, a second aspect of the present disclosure is a method for manufacturing an imaging element, the method including a step of forming a pixel array unit in which pixels that perform photoelectric conversion according to incident light components, a plurality of phase difference pixels that is included in the pixels, is arranged adjacent to each other, and detects a phase difference, and phase difference pixel adjacent pixels that are included in the pixels and are adjacent to the phase difference pixels are arranged two-dimensionally, a step of forming an individual on-chip lens that is arranged for each of the pixels and individually condenses the incident light components on corresponding one of the pixels, a step of forming a common on-chip lens that is commonly arranged in the plurality of phase difference pixels and commonly condenses the incident light components, and a step of forming an adjacent on-chip lens that is arranged for each of the phase difference pixel adjacent pixels, individually condenses the incident light components on corresponding one of the phase difference pixel adjacent pixels, and is formed to have a size different from the individual on-chip lens to adjust a shape of the common on-chip lens.

In the above-described aspects, the adjacent on-chip lens is formed to have a size different from the individual on-chip lens, so that an effect of adjusting the shape of the common on-chip lens is obtained. It is assumed that the individual on-chip lens, the adjacent on-chip lens, and the common on-chip lens are manufactured by a common step.

Effects of the Invention

According to the present disclosure, it is possible to obtain an excellent effect of simplifying a step of forming an on-chip lens of a phase difference pixel.

BRIEF DESCRIPTION OF DRAWINGS

FIGS. 5A, 5B, and 5C are diagrams illustrating a configuration example of the color filters according to the embodiments of the present disclosure.

FIGS. 6A, 6B, and 6C are diagrams illustrating another configuration example of the color filters according to the embodiments of the present disclosure.

MODE FOR CARRYING OUT THE INVENTION

Next, modes for carrying out the present disclosure (hereinafter, referred to as embodiments) will be described with reference to the drawings. In the following drawings, the same or similar reference signs are given to the same or similar parts. However, the drawings are schematic, and a dimensional ratio of each part and the like do not always match an actual ones. Furthermore, it is needless to say that portions having different dimensional relationships and ratios between the drawings are also included. In addition, the embodiments will be described in the following order.
1. First Embodiment
2. Second Embodiment
3. Third Embodiment
4. Application Example to Camera <1. First Embodiment>

[Configuration of Imaging Element]

Figure 1:
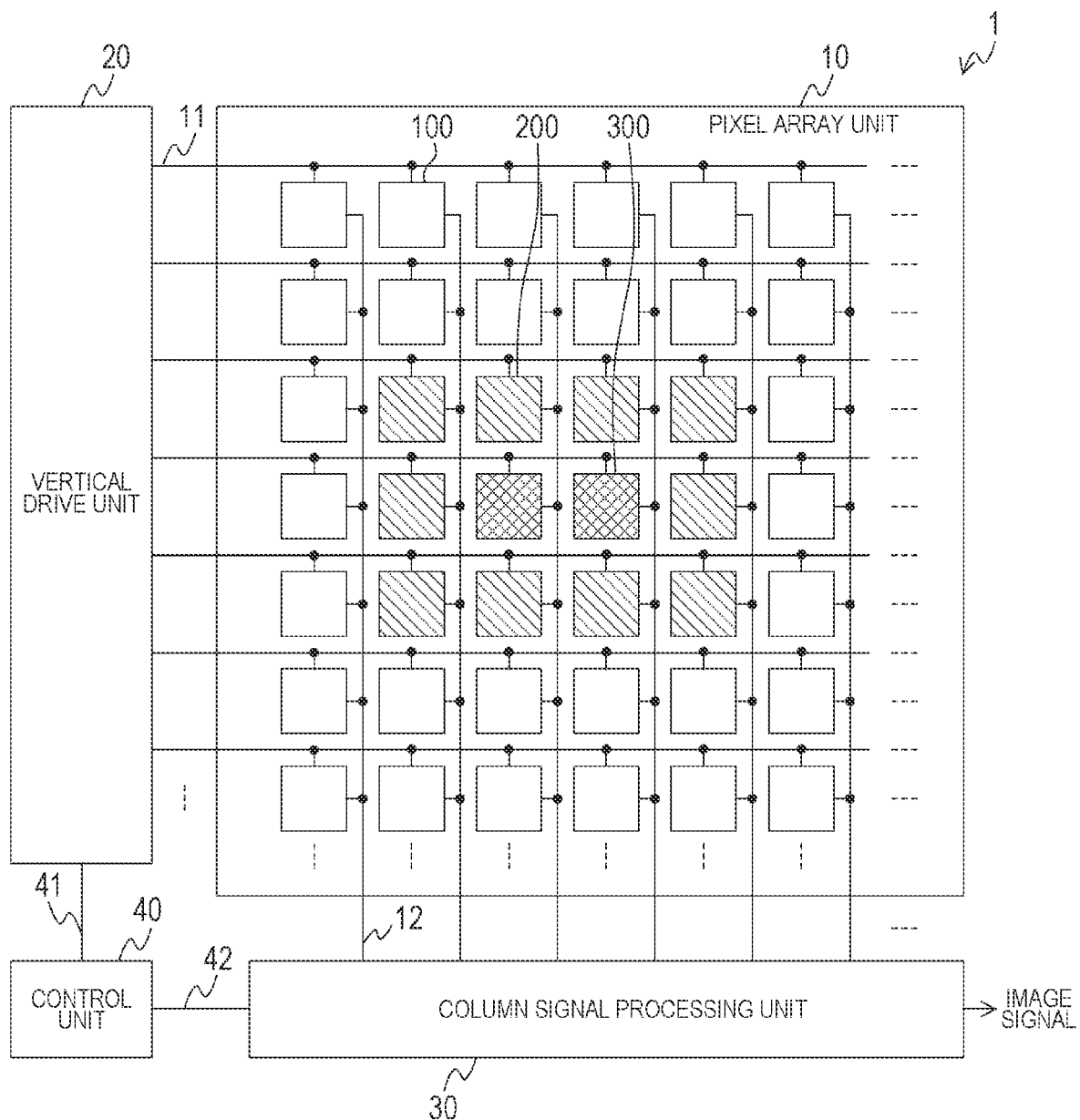
FIG. 1 is a diagram illustrating a configuration example of an imaging element according to embodiments of the present disclosure.

FIG. 1 is a cross-sectional view illustrating a configuration example of an imaging element according to the embodiments of the present disclosure. An imaging element 1 in FIG. 1 includes a pixel array unit 10, a vertical drive unit 20, a column signal processing unit 30, and a control unit 40.

The pixel array unit 10 is formed by arranging pixels 100 in a two-dimensional lattice shape. Here, each of the pixels 100 generates an image signal according to an applied light component. The pixel 100 includes a photoelectric conversion unit that generates an electric charge according to the applied light component. The pixel 100 further includes a pixel circuit. This pixel circuit generates an image signal based on the electric charge generated by the photoelectric conversion unit. The generation of the image signal is controlled by a control signal generated by the vertical drive unit 20 described later. In the pixel array unit 10, signal lines 11 and 12 are arranged in an X-Y matrix. The signal line 11 is a signal line that transmits the control signal for the pixel circuit of the pixel 100, is arranged for each row of the pixel array unit 10, and is commonly wired to the pixels 100 arranged in each row. The signal line 12 is a signal line that transmits the image signal generated by the pixel circuit of the pixel 100, is arranged for each column of the pixel array unit 10, and is commonly wired to the pixels 100 arranged in each column. These photoelectric conversion units and pixel circuits are formed on a semiconductor substrate.

The vertical drive unit 20 generates the control signal for the pixel circuit of the pixel 100. The vertical drive unit 20 transmits the generated control signal to the pixel 100 via the signal line 11 in FIG. 1. The column signal processing unit 30 processes the image signal generated by the pixel 100. The column signal processing unit 30 processes the image signal transmitted from the pixel 100 via the signal line 12 in FIG. 1. The processing in the column signal processing unit 30 corresponds to, for example, analog-digital conversion that converts an analog image signal generated in the pixel 100 into a digital image signal. The image signal processed by the column signal processing unit 30 is output as an image signal of the imaging element 1. The control unit 40 controls the entire imaging element 1. The control unit 40 controls the imaging element 1 by generating and outputting control signals that control the vertical drive unit 20 and the column signal processing unit 30. The control signals generated by the control unit 40 are transmitted to the vertical drive unit 20 and the column signal processing unit 30 via signal lines 41 and 42, respectively.

In addition to the pixels 100, phase difference pixels 300 and phase difference pixel adjacent pixels 200 are further arranged in the pixel array unit 10 described above. In FIG. 1, pixels hatched with crossing oblique lines and pixels hatched with parallel oblique lines correspond to the phase difference pixels 300 and the phase difference pixel adjacent pixels 200, respectively. The phase difference pixels 300 are pixels for detecting an image plane phase difference. The phase difference pixels 300 are arranged adjacent to each other on the left and right, for example, to perform pupil division. A plurality of such phase difference pixels 300 adjacent to each other on the left and right is linearly arranged in the pixel array unit 10. Image signals generated by the plurality of phase difference pixels 300 are output from the imaging element 1 and processed by a device such as a camera that uses the imaging element 1. Specifically, the image signals generated by the phase difference pixels 300 adjacent to each other on the left and right generate images by light components transmitted through a right side and a left side of an imaging lens. When a phase difference in these images is detected, a focal position of a subject is detected, and a position of the imaging lens is adjusted on the basis of the detected focal position, so that autofocus is executed.

Furthermore, the phase difference pixel adjacent pixels 200 are pixels arranged adjacent to the two phase difference pixels 300 so as to surround a periphery of the two phase difference pixels 300. In the phase difference pixels 300 and the phase difference pixel adjacent pixels 200, photoelectric conversion units and pixel circuits having the same configurations as those in the pixels 100 are arranged. That is, the phase difference pixels 300 and the phase difference pixel adjacent pixels 200 can have the same configuration as the pixels 100 in a diffusion region or the like of the semiconductor substrate. As will be described later, on-chip lenses having different shapes are arranged in the pixels 100, the phase difference pixels 300, and the phase difference pixel adjacent pixels 200. Here, the on-chip lenses are lenses that condense light components from the subject on the photoelectric conversion units of the pixels 100 and the like.

[Configuration of On-Chip Lens]

Figure 2:
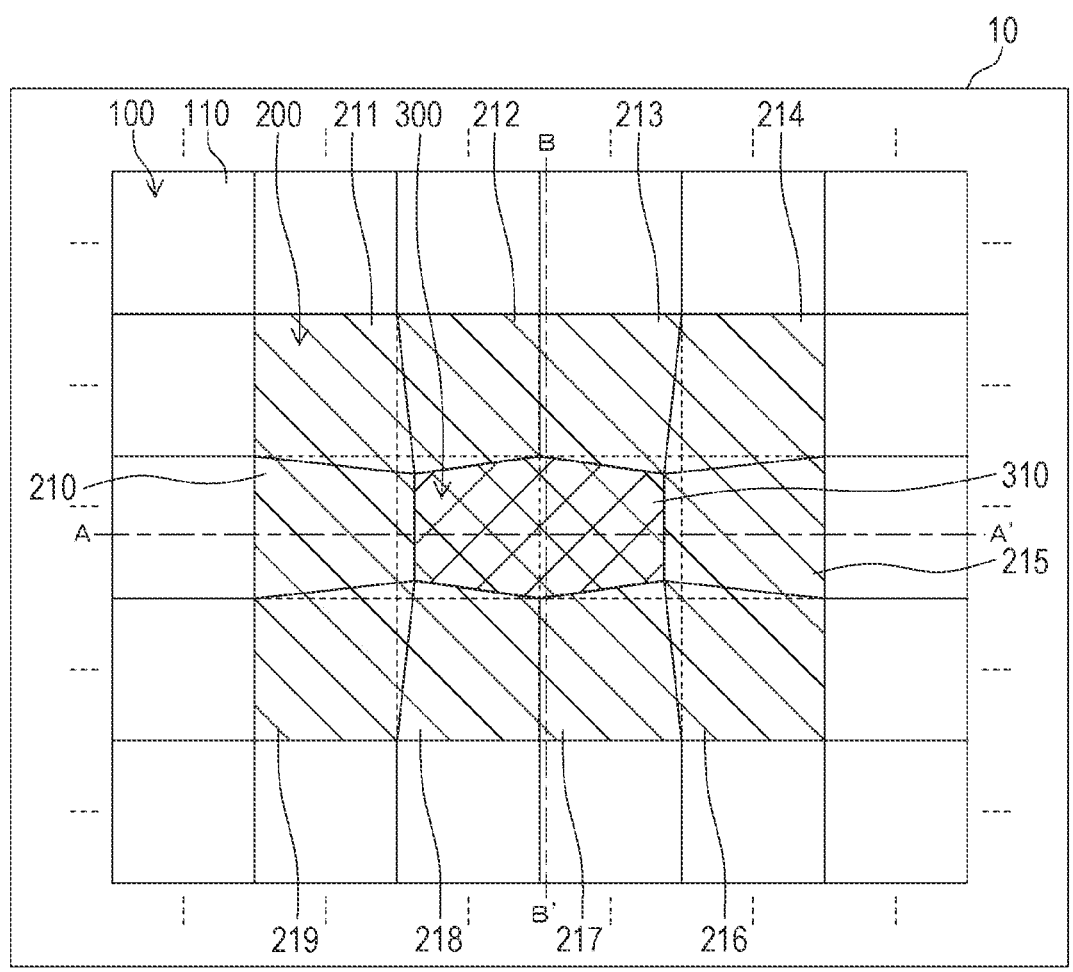
FIG. 2 is a diagram illustrating a configuration example of on-chip lenses according to a first embodiment of the present disclosure.

FIG. 2 is a diagram illustrating a configuration example of the on-chip lenses according to the first embodiment of the present disclosure. FIG. 2 is a diagram illustrating a configuration example of the pixel array unit 10, and is a diagram illustrating the configuration example of the on-chip lenses in the pixels 100, the phase difference pixel adjacent pixels 200, and the phase difference pixels 300. As described with reference to FIG. 1, the pixel array unit 10 is formed such that the phase difference pixel adjacent pixels 200 and the phase difference pixels 300 are arranged among the plurality of pixels 100. In FIG. 2, solid squares represent on-chip lenses 110 of the pixels 100. A solid hexagon hatched with crossing oblique lines represents an on-chip lens 310 that is commonly arranged in the two phase difference pixels 300 (hereinafter referred to as a common on-chip lens). Solid quadrangles hatched with parallel oblique lines other than the on-chip lenses 110 and the common on-chip lens 310 represent on-chip lenses of the phase difference pixel adjacent pixels 200. The on-chip lenses of the phase difference pixel adjacent pixels 200 are referred to as adjacent on-chip lenses. In FIG. 2, adjacent on-chip lenses 210 to 219 are arranged around the common on-chip lens 310. Note that each of the on-chip lenses 110 is an example of an individual on-chip lens described in the claims.

The on-chip lenses 110 are formed to have substantially the same shape as the pixels 100 in a plan view, and each have a rectangular bottom surface. A curved surface is formed convexly from this bottom surface to form a lens shape, so that incident light components are condensed. Furthermore, the phase difference pixels 300 and the phase difference pixel adjacent pixels 200 are formed to have substantially the same shape as the pixels 100. Dotted lines in FIG. 2 represent the phase difference pixel adjacent pixels 200 and the phase difference pixels 300. As illustrated in FIG. 2, the common on-chip lens 310 is formed to have a shape with an area smaller than a total area of the two phase difference pixels 300. Furthermore, the common on-chip lens 310 is formed as a hexagon in which long sides of a rectangular shape formed with the two phase difference pixels 300 are divided into two parts and taper toward short sides of the rectangular shape, and is formed to have a bottom surface that approximates an ellipse. In addition, the common on-chip lens 310 is formed to have a shape in which a size in the long side direction described above is reduced. By forming the common on-chip lens 310 to have such a shape, it is possible to improve the separation accuracy of pupil division in the phase difference pixels 300 and improve the detection accuracy of the phase difference. Details of the shape of the common on-chip lens 310 will be described later.

The adjacent on-chip lenses 210 to 219 arranged around the common on-chip lens 310 are formed to have shapes and sizes different from the on-chip lenses 110. Specifically, the adjacent on-chip lenses 210 to 219 are formed to have shapes in which regions adjacent to the phase difference pixels 300 overhang the phase difference pixels 300, and formed to have sizes larger than the on-chip lenses 110. Furthermore, among the adjacent on-chip lenses 210 to 219, the adjacent on-chip lenses 211, 214, 216, and 219 adjacent to the common on-chip lens 310 at apexes are formed to have sizes larger than the adjacent on-chip lenses 210, 212, 213, 215, 217, and 218 adjacent to the common on-chip lens 310 on sides. As a result, the adjacent on-chip lenses 210 to 219 are formed to have shapes in which regions adjacent to the vicinity of the above-described short sides of the common on-chip lens 310 overhang the phase difference pixels 300. The shape of the common on-chip lens 310 is adjusted by the overhang of the adjacent on-chip lenses. By forming the adjacent on-chip lenses 210 to 219 to have sizes larger than the on-chip lenses 110, it is possible to adjust the shape of the common on-chip lens 310.

[Configuration of Imaging Element]

Figure 3:
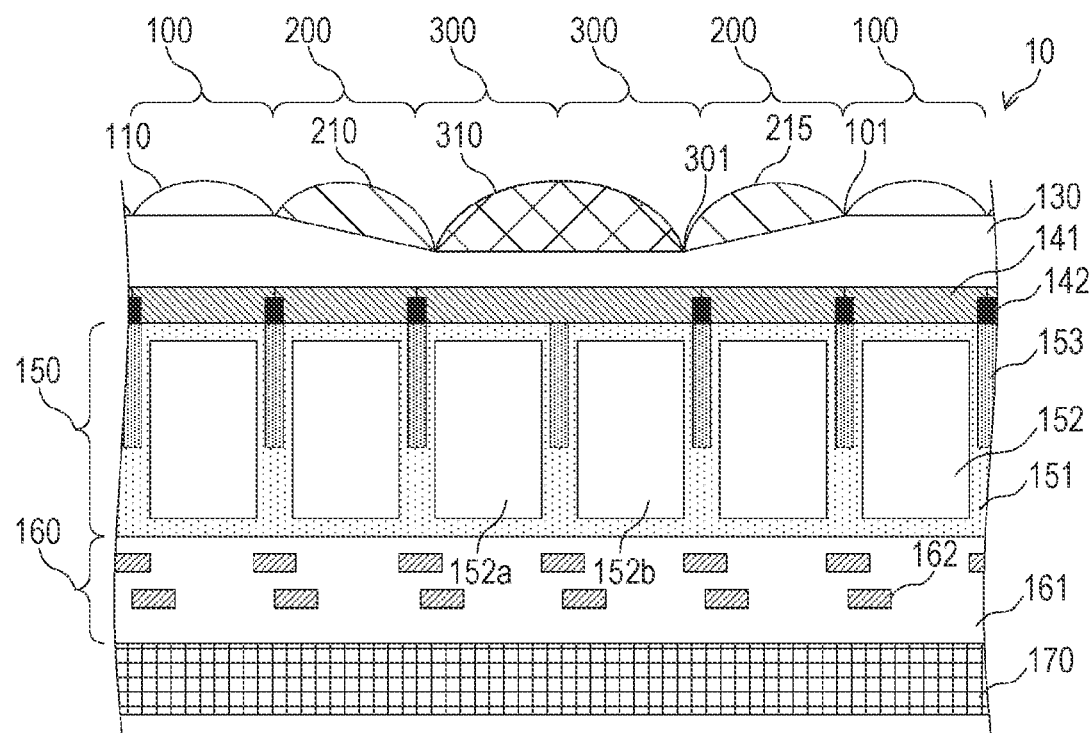
FIG. 3 is a cross-sectional view illustrating a configuration example of the imaging element according to the first embodiment of the present disclosure.

FIG. 3 is a cross-sectional view illustrating a configuration example of the imaging element according to the first embodiment of the present disclosure. FIG. 3 is a cross-sectional view illustrating a configuration of a cross section of the imaging element 1 (pixel array unit 10) along a line A-A' in FIG. 2. The imaging element 1 in FIG. 3 includes a semiconductor substrate 150, a wiring region 160, color filters 141, light-shielding films 142, a flattening film 130, the on-chip lenses 110, and a support substrate 170. Note that, in the phase difference pixels 300, the common on-chip lens 310 is arranged instead of the on-chip lenses 110. In the phase difference pixel adjacent pixels 200, the adjacent on-chip lenses 210 and 215 are arranged instead of the on-chip lenses 110.

The semiconductor substrate 150 is a semiconductor substrate on which semiconductor element portions of the photoelectric conversion units and the pixel circuits of the pixels 100 and the like are formed. Furthermore, semiconductor elements of the vertical drive unit 20 and the like described with reference to FIG. 1 are further formed on the semiconductor substrate 150. In FIG. 3, the photoelectric conversion units among these semiconductor elements are illustrated. Elements such as the photoelectric conversion units are formed in a well region 151 formed in the semiconductor substrate 150. For convenience, it is assumed that the semiconductor substrate 150 in FIG. 3 forms a p-type well region 151. An n-type semiconductor region 152 is formed for each pixel in the p-type well region 151. A photodiode is formed by a p-n junction formed at an interface between the n-type semiconductor region 152 and the p-type well region 151 around the n-type semiconductor region 152. This photodiode corresponds to the photoelectric conversion unit. In the semiconductor substrate 150, separation portions 153 are arranged at the boundary of the pixels 100 and the like. Each of the separation portions 153 includes an insulating film or the like, and electrically separates the pixels 100 and the like.

The wiring region 160 is a region where wiring of the pixel circuits and the like is formed. This wiring region includes a wiring layer 162 and an insulating layer 161. The wiring layer 162 is a wiring that includes metal or the like and transmits a signal such as an image signal. The insulating layer 161 insulates the wiring layer 162. The wiring layer 162 and the insulating layer 161 can be formed in multiple layers.

The support substrate 170 is a substrate that supports the imaging element 1. Arranging the support substrate 170 can improve the strength of the imaging element 1 in a manufacturing step of the imaging element 1.

Each of the color filters 141 is an optical filter through which a light component having a predetermined wavelength among the incident light components is transmitted. As the color filters 141, color filters 141 through which a red light component, a green light component, and a blue light component are transmitted can be used. The light-shielding films 142 are arranged at the boundary of the color filters 141 adjacent to each other to block the incident light components obliquely transmitted through the color filters 141. Arranging the light-shielding films 142 can prevent color mixing. Each of the light-shielding films 142 can include a material having a light-shielding property, for example, metal such as aluminum or tungsten.

The flattening film 130 is a film that flattens surfaces of the pixels 100 and the like. This flattening film 130 can include a resin or the like, and can include the same material as the on-chip lenses 110 and the like described later.

The on-chip lenses 110, the adjacent on-chip lenses 210 and 215, and the common on-chip lens 310 are lenses that condense the incident light components on the pixels 100 and the like as described above. The on-chip lenses 110 condense the incident light components on the vicinity of surfaces of the n-type semiconductor regions 152 of the pixels 100. Similarly, the adjacent on-chip lenses 210 and 215 condense the incident light components on the vicinity of surfaces of the n-type semiconductor regions 152 of the phase difference pixel adjacent pixels 200. The on-chip lenses 110, the adjacent on-chip lenses 210 and 215, and the common on-chip lens 310 can include, for example, an organic material such as a styrene resin, an acrylic resin, a styrene-acrylic copolymer resin, or a siloxane resin. Furthermore, inorganic material such as silicon nitride or silicon oxynitride can also be included. Note that the imaging element 1 in FIG. 3 corresponds to a back-illuminated imaging element in which the incident light components are applied to a back surface, which is a surface different from a front surface on which the wiring region 160 is arranged in the semiconductor substrate 150.

The common on-chip lens 310 is arranged so as to straddle the two phase difference pixels 300. Therefore, a light component transmitted mainly through the right side of the imaging lens is incident on an n-type semiconductor region 152a of a phase difference pixel 300 on a left side of FIG. 3. A light component transmitted mainly through the left side of the imaging lens is incident on an n-type semiconductor region 152b of a phase difference pixel 300 on a right side of FIG. 3. As a result, it is possible to execute the pupil division in a left-right direction. By detecting the phase difference in the images with the image signals of these two phase difference pixels 300, it is possible to measure a defocus amount and detect the focal position of the imaging lens.

In order to accurately detect the focal position, it is necessary to improve the separation accuracy of the pupil-divided phase difference pixels 300. For this purpose, it is necessary to arrange a condensing position of the common on-chip lens 310 at the center of the two phase difference pixels 300 and reduce a region where the light components are condensed to a circular region. Therefore, the common on-chip lens 310 is formed to have a size smaller than a region where the two phase difference pixels 300 are combined, and a curvature of the common on-chip lens 310 is increased to form a hemispherical shape. As illustrated in FIG. 3, an end portion 301 of the common on-chip lens 310 is formed at a position deeper than an end portion 101 of the on-chip lens 110, so that the curvature of the common on-chip lens 310 can be increased. By adjusting the shape of the common on-chip lens 310 in this way, it is possible to form a point-shaped condensing region, and improve the separation accuracy of the pupil division.

The adjacent on-chip lenses 210 and 215 in FIG. 3 are formed so that end portions adjacent to the common on-chip lens 310 overhang in a direction of the common on-chip lens 310, and are formed to have bottom surfaces with widths larger than the on-chip lenses 110. Furthermore, the adjacent on-chip lenses 210 and 215 are formed to have the same depth as the end portion 301 of the common on-chip lens 310. As a result, the shape of the common on-chip lens 310 can be adjusted as described above.

Figure 4:
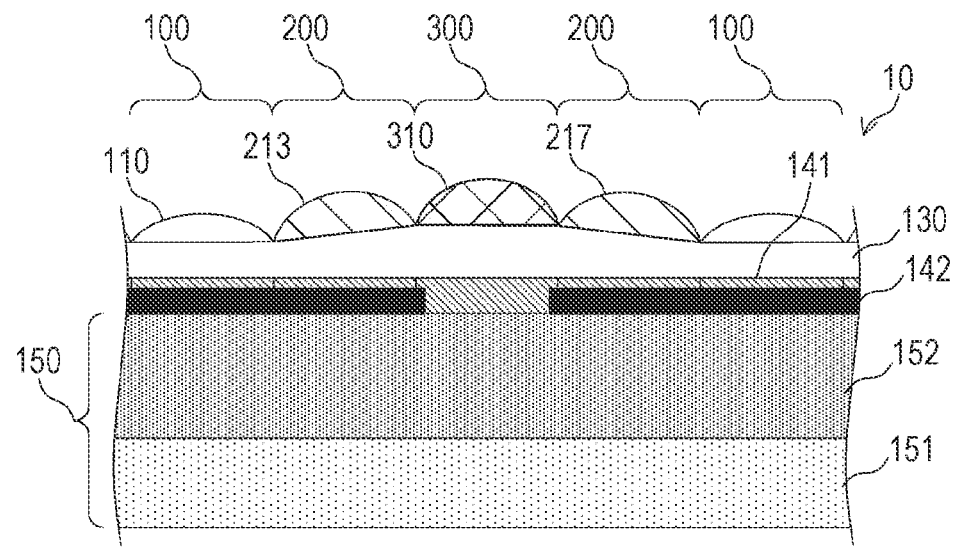
FIG. 4 is a diagram illustrating a configuration example of color filters according to the embodiments of the present disclosure.

FIG. 4 is a cross-sectional view illustrating a configuration example of the imaging element according to the first embodiment of the present disclosure. FIG. 4 is a cross-sectional view illustrating a configuration of a cross section of the imaging element 1 along a line B-B' in FIG. 2, and is a cross-sectional view illustrating a configuration of the vicinity of the boundary between the two phase difference pixels 300. Since the cross section of the imaging element 1 along the line B-B' corresponds to a cross section of a region where two on-chip lenses 110 are in contact with each other, the on-chip lenses 110 have thinner thicknesses than in FIG. 3. On the other hand, the common on-chip lens 310 is formed to have the same thickness as the common on-chip lens 310 of FIG. 3. The adjacent on-chip lenses 213 and 217 are formed to have substantially the same width as the phase difference pixel adjacent pixels 200, and are formed to have shapes in contact with the common on-chip lens 310.

[Configuration of Color Filter]

Figures 5A, 5B, 5C:
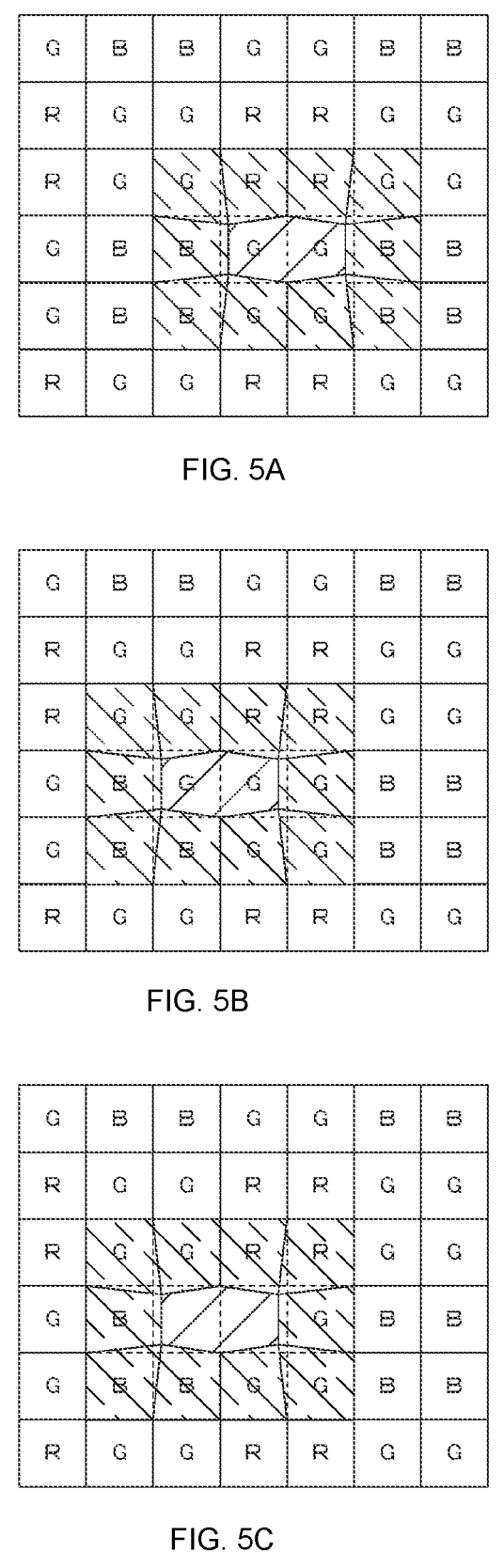

FIGS. 5A, 5B, and 5C are diagrams illustrating a configuration example of the color filters according to the embodiments of the present disclosure. FIGS. 5A, 5B, and 5C are diagrams illustrating an example of arrangement of the color filters 141 in the pixel array unit 10 described with reference to FIG. 2. In FIGS. 5A, 5B, and 5C, the description of reference signs of parts that are the same as those of FIG. 2 is omitted. Characters described in FIGS. 5A, 5B, and 5C represent types of the color filters 141 that are arranged. "R", "G", and "B" in FIGS. 5A, 5B, and 5C represent the color filters 141 corresponding to the red light component, the green light component, and the blue light component, respectively. Furthermore, in FIGS. 5A, 5B, and 5C, four pixels 100 of two rows and two columns in which the same types of color filters 141 are arranged are arranged in a Bayer array. Here, the Bayer array is an array in which the color filters 141 corresponding to the green light component are arranged in a checkered shape, and the color filters 141 corresponding to the red light component and the blue light component are arranged between the color filters corresponding to the green light component.

FIG. 5A illustrates an example where the phase difference pixels 300 are arranged at positions of pixels in which the color filters 141 corresponding to green are arranged according to the Bayer array. The phase difference pixels 300 can be arranged without disturbing the array of the color filters 141 in the pixel array unit 10.

FIG. 5B illustrates an example where the color filters 141 corresponding to the green light component are arranged in the phase difference pixels 300. The pixel array unit 10 can be formed so that priority is given to the arrangement of the phase difference pixels 300.

FIG. 5C illustrates an example where the arrangement of the color filters 141 in the phase difference pixels 300 is omitted. In this case, for example, the thickened flattening film 130 can be arranged in a region of the phase difference pixels 300 where the color filters 141 are arranged.

Figures 6A, 6B, 6C:
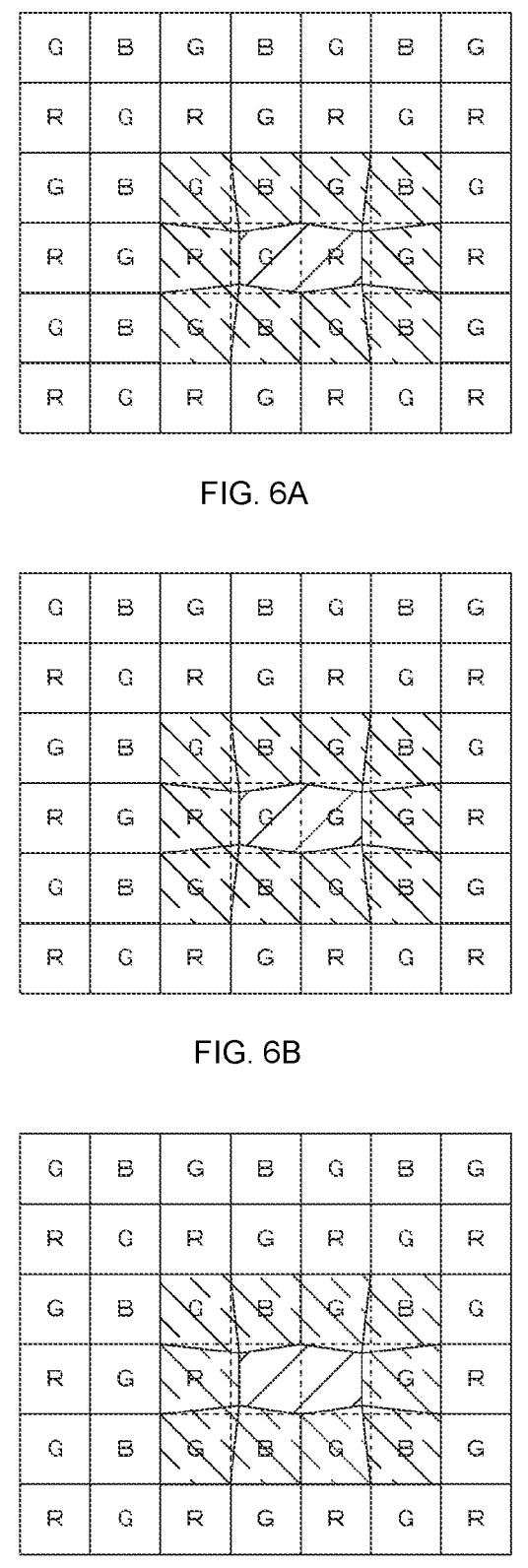

FIGS. 6A, 6B, and 6C are diagrams illustrating another configuration example of the color filters according to the embodiment of the present disclosure. FIGS. 6A, 6B, and 6C illustrate an example where the pixels 100 of two rows and two columns arranged in the Bayer array are arranged. FIG. 6A represents an example where different color filters 141 are arranged in the two phase difference pixels 300. FIG. 6B illustrates an example where the color filters 141 corresponding to the green light component are arranged in the phase difference pixels 300. FIG. 6C illustrates an example where the arrangement of the color filters 141 in the phase difference pixels 300 is omitted.

[Method for Manufacturing Imaging Element]

Figure 7A:
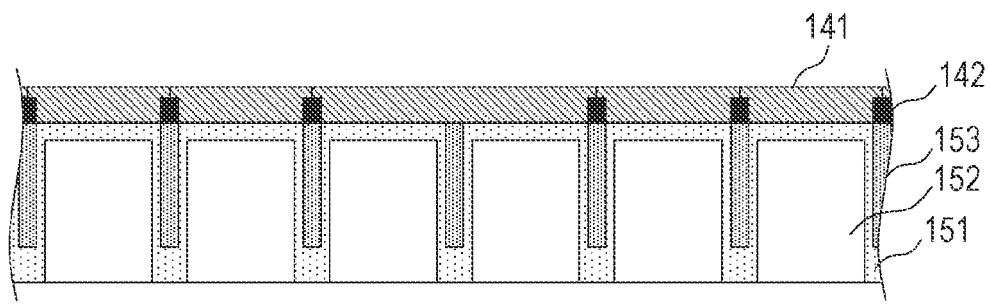
FIGS. 7A, 7B, and 7C are diagrams illustrating an example of a method for manufacturing the imaging element according to the first embodiment of the present disclosure.

FIGS. 7A, 7B, 7C, 8A, 8B, and 8C are diagrams illustrating an example of a method for manufacturing the imaging element according to the first embodiment of the present disclosure. FIGS. 7A, 7B, 7C, 8A, 8B, and 8C are diagrams illustrating an example of the manufacturing step of the imaging element 1. First, the p-type well region 151 and the n-type semiconductor regions 152 are formed in the semiconductor substrate 150. Next, the wiring region 160 is formed on the semiconductor substrate 150, and the support substrate 170 is bonded to the wiring region 160. Next, the back surface of the semiconductor substrate 150 is ground to be made thinner. Next, p-type separation regions are formed between the pixels 100. This formation can be performed by ion implantation. Next, trenches are formed in the separation regions, and the separation portions 153 are arranged in these trenches. Next, the light-shielding films 142 and the color filters 141 are arranged on the back surface of the semiconductor substrate 150 (FIG. 7A). As a result, the pixel array unit 10 can be formed. Note that the step is an example of a step of forming a pixel array unit described in the claims.

Figure 7B:
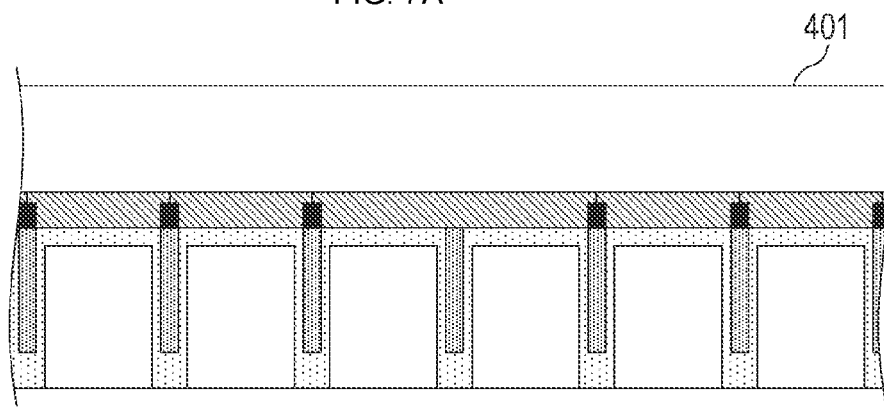
Figure 7C:
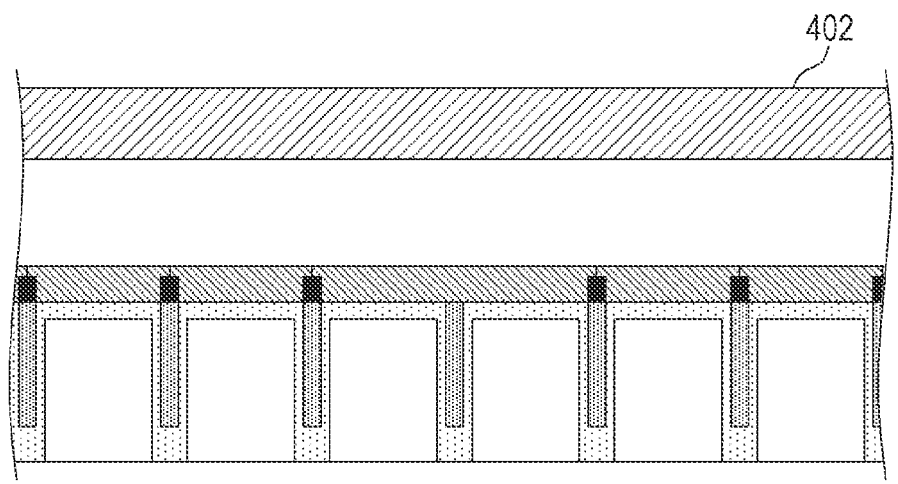
Figure 8A:
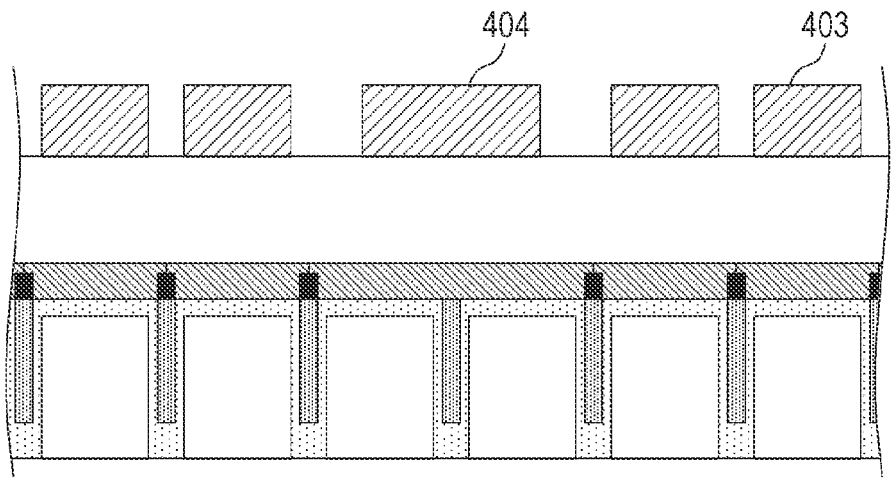
FIGS. 8A, 8B, and 8C are diagrams illustrating an example of the method for manufacturing the imaging element according to the first embodiment of the present disclosure.

Next, an on-chip lens material 401 that is a material of the on-chip lenses 110 and the like is arranged on surfaces of the color filters 141 (FIG. 7B). Next, a resist 402 is arranged on a surface of the on-chip lens material 401 (FIG. 7C). Next, the resist 402 is patterned to form resists 403 and 404. This patterning can be performed by the resist 402 being exposed and developed in shapes of quadrangular prisms. At this time, the resists 403 each having a bottom surface smaller than the pixels 100 are arranged in regions where the on-chip lenses 110 and the adjacent on-chip lenses 210 to 219 are formed. On the other hand, in a region where the common on-chip lens 310 is formed, the resist 404 formed to be horizontally longer than the resist 403 is arranged (FIG. 8A).

Figure 8B:
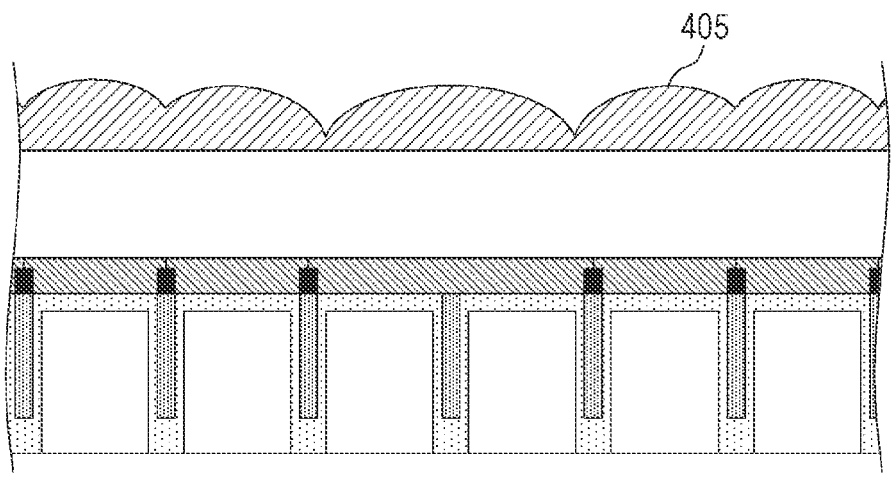
Figure 8C:
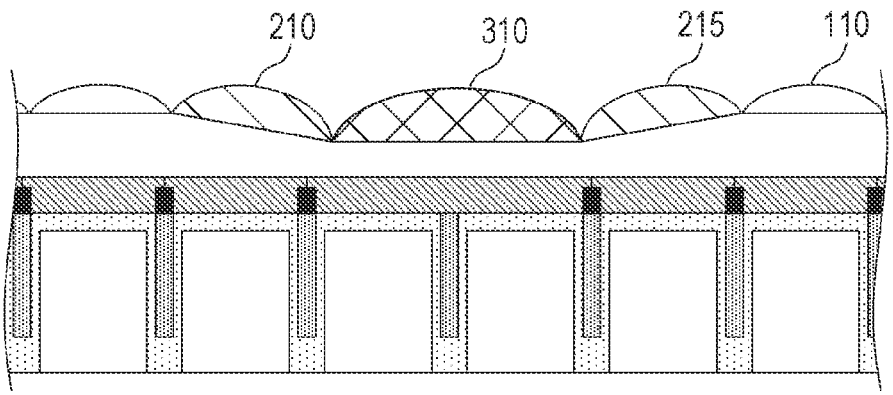

Next, the imaging element 1 is heated to a temperature equal to or higher than a softening point of the resists 403 and 404. This heating can be performed by a reflow furnace. As a result, the resists 403 and 404 are softened to form curved surfaces, and end portions of adjacent resists 403 adhere to each other to form a resist 405 (FIG. 8B). Next, the resist 405 and the on-chip lens material 401 are etched. This etching can be performed by dry etching (FIG. 8C). As a result, a shape of the resist 405 can be transferred to the on-chip lens material 401, and the on-chip lenses 110, the adjacent on-chip lenses 210 to 219, and the common on-chip lens 310 can be formed at the same time.

Note that the step of forming the common on-chip lens 310 is an example of a step of forming a common on-chip lens described in the claims. The step of forming the adjacent on-chip lenses 210 to 219 is an example of a step of forming an adjacent on-chip lens described in the claims. The step of forming the on-chip lenses 110 is an example of a step of forming an individual on-chip lens described in the claims.

[Method for Manufacturing On-Chip Lens]

Figure 9:
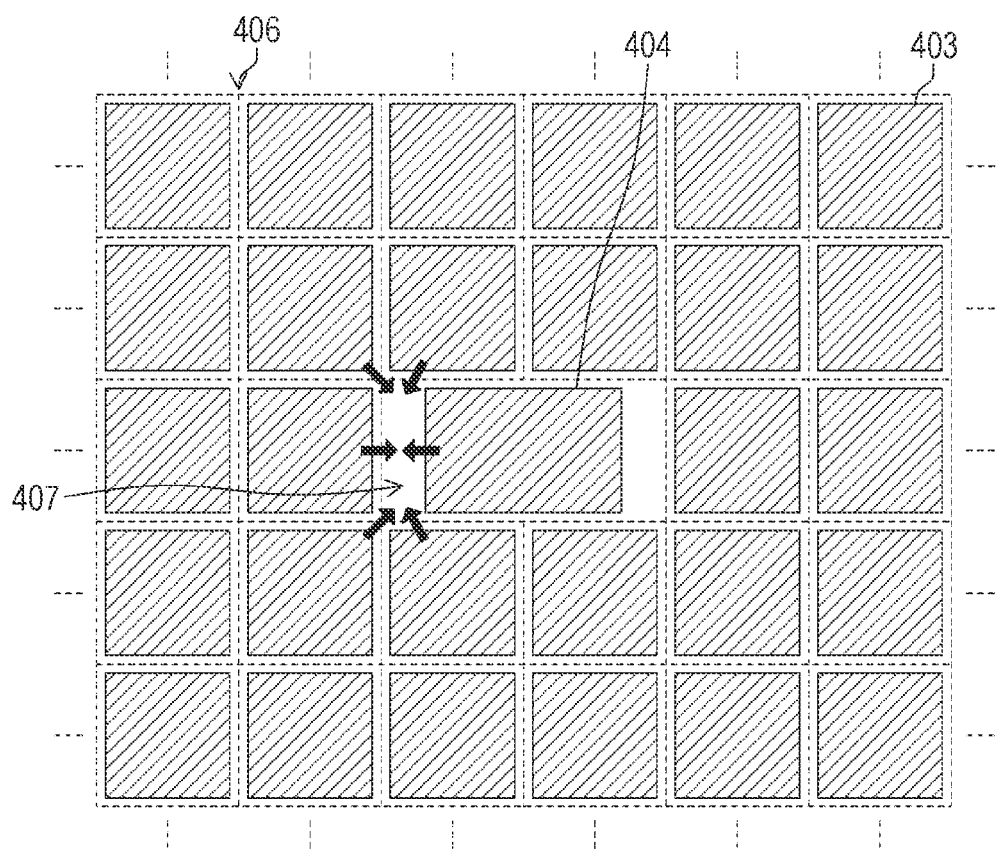
FIG. 9 is a diagram illustrating an example of a method for manufacturing the on-chip lenses according to the first embodiment of the present disclosure.

FIG. 9 is a diagram illustrating an example of a method for manufacturing the on-chip lenses according to the first embodiment of the present disclosure. FIG. 9 is a diagram illustrating configuration examples of the resists 403 and 404 described with reference to FIG. 8A. As illustrated in FIG. 9, gaps 406 are formed between the adjacent resists 403. The resist 404 is formed to have short sides with the same width as the resist 403 and long sides that are relatively short. As a result, gaps 407 wider than the gaps 406 are formed between the resist 404 and the resists 403 adjacent to the resist 404 on the short sides. That is, the relatively wide gap 407 is formed between the resists 403 arranged at positions corresponding to the adjacent on-chip lenses 210 to 219 and the resist 404 corresponding to the common on-chip lens 310.

Next, when the resists 403 and 404 are softened by reflow heating, corners of the resist 403 and the like are eluted in regions of the gaps 406 to form the curved surfaces of the on-chip lenses 110. As a result, the resist 405 of FIG. 8B can be generated. A part of the softened resists 403 and 404 also flows into the gaps 407. However, since the gap 407 is wider than the gap 406, a shape of a resist adjacent to the gap 407 after inflow is different from that of the resist 403 adjacent to the gap 406. Arrows in FIG. 9 illustrate a state of the inflow of the resists 403 and 404 in the gap 407. The resists 403 corresponding to the adjacent on-chip lenses 210 to 219 flow into positions overhanging in directions of the phase difference pixels 300. On the other hand, a shape of the resist 404 in the vicinity of the short sides is adjusted by the inflow of the adjacent resists 403. As a result, the resist 405 described with reference to FIG. 8B can be formed.

[Modified Example]

In the imaging element 1 described above, the light-shielding film 142 is omitted and the separation portion 153 is arranged between the phase difference pixels 300, but another configuration may be used.

Figure 10A:
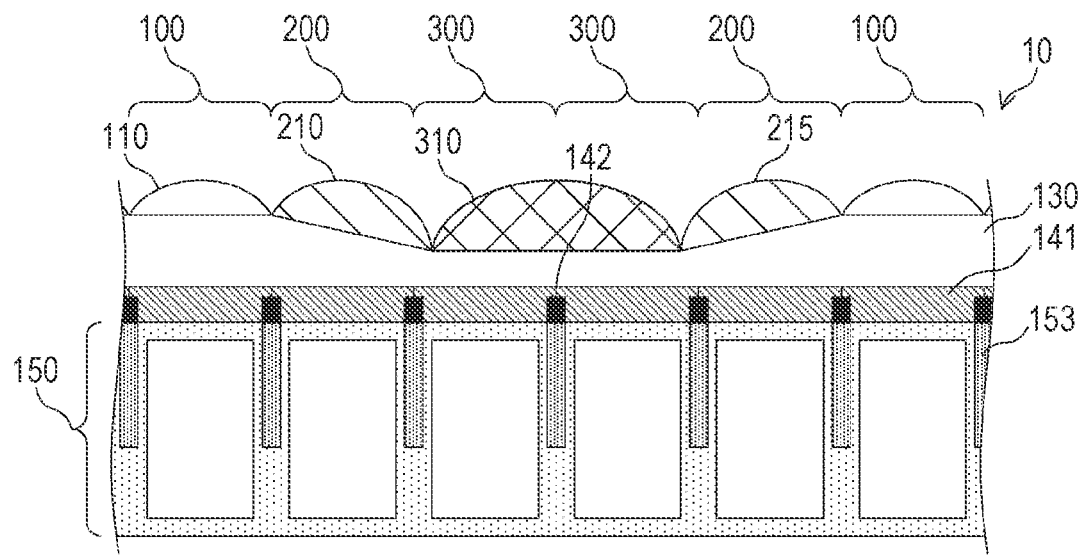
FIGS. 10A and 10B are cross-sectional views illustrating a configuration example of an imaging element according to a modified example of the first embodiment of the present disclosure.
Figure 10B:
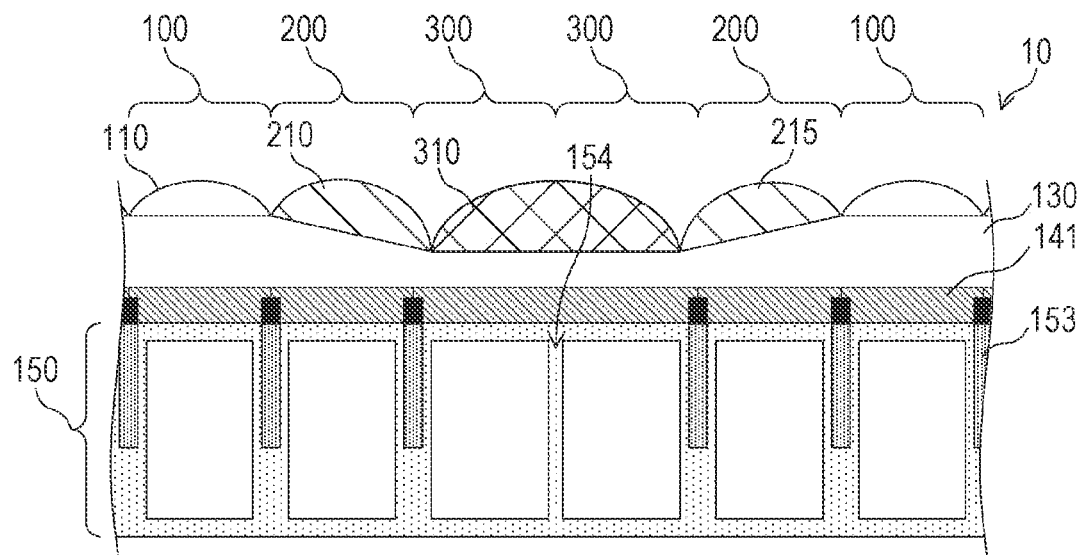

FIGS. 10A and 10B are cross-sectional views illustrating a configuration example of an imaging element according to a modified example of the first embodiment of the present disclosure. FIG. 10A illustrates an example where the light-shielding film 142 is arranged between the phase difference pixels 300. Furthermore, FIG. 10B illustrates an example where the separation portion 153 between the phase difference pixels 300 is omitted and only a separation region 154 is arranged. Note that the light-shielding film 142 may be arranged in the imaging element 1 in FIG. 10B.

Figure 11:
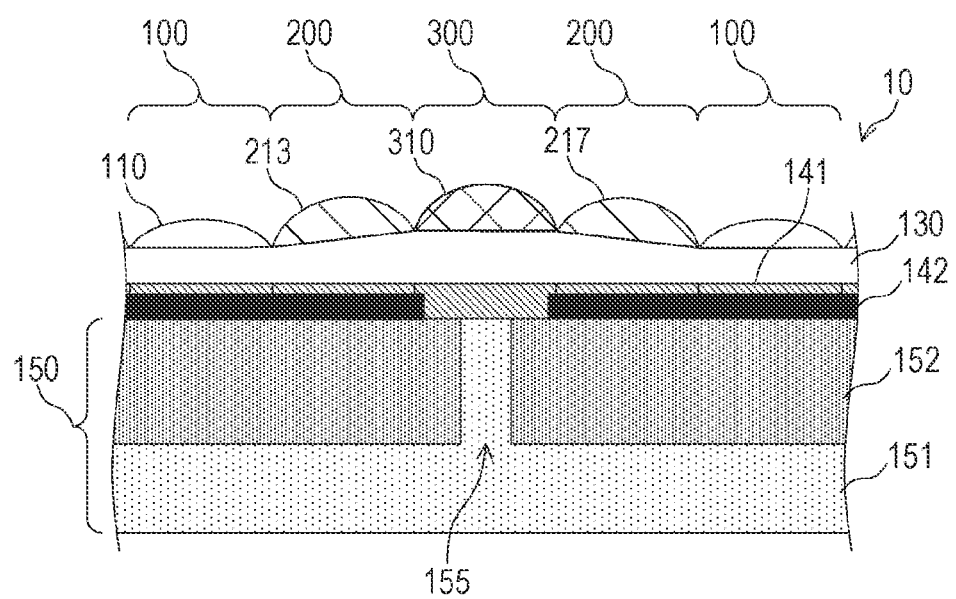
FIG. 11 is a cross-sectional view illustrating another configuration example of the imaging element according to the modified example of the first embodiment of the present disclosure.

FIG. 11 is a cross-sectional view illustrating another configuration example of the imaging element according to the modified example of the first embodiment of the present disclosure. FIG. 11 illustrates an example where a gap 155 is formed in the separation portion 152 arranged in the phase difference pixels 300. In the phase difference pixels 300 described with reference to FIG. 4, the separation portion 152 is arranged to separate the two phase difference pixels 300. However, the incident light components of the phase difference pixels 300 may be scattered by the separation portion 152, and the accuracy of the pupil division may decrease. In such a case, the scattering of the incident light components can be reduced by formation of the gap 155.

Note that the configuration of the imaging element 1 of the first embodiment of the present disclosure is not limited to this example. For example, the common on-chip lens 310 described with reference to FIG. 2 is commonly arranged in the two phase difference pixels 300, but a common on-chip lens commonly arranged in four phase difference pixels 300 may also be used. Furthermore, the imaging element 1 may be a front-illuminated imaging element in which the incident light components are applied from a side of the wiring region 160 of the semiconductor substrate 150.

As described above, in the imaging element 1 of the first embodiment of the present disclosure, the adjacent on-chip lenses 210 to 219 are formed to have sizes different from the on-chip lenses 110, so that the shape of the common on-chip lens 310 is adjusted. As a result, the manufacturing step of the common on-chip lens 310 and the like can be simplified while the separation accuracy in the pupil division of the phase difference pixels 300 is improved.

<2. Second Embodiment>

In the imaging element 1 of the above-described first embodiment, the on-chip lenses 110 and the like of the pixel array unit 10 are arranged at the same position relative to the pixels 100 and the like. On the other hand, an imaging element 1 of a second embodiment of the present disclosure is different from the above-described first embodiment in that on-chip lenses 110 and the like are shifted and arranged according to an incident angle of incident light components on pixels 100 and the like.

As described above, the imaging element 1 is arranged in a camera or the like, and light components from a subject are applied through an imaging lens. A camera lens including this imaging lens is arranged at a position where an optical axis of the camera lens coincides with an optical center of a pixel array unit 10. Here, the optical center is a center of a region of the imaging element 1 (pixel array unit 10) to which the light components from the subject are applied. However, since the pixel array unit 10 of the imaging element 1 is formed to be flat, the light components from the subject are obliquely incident on an end portion of the pixel array unit 10. Therefore, condensing positions of the on-chip lenses 110 and the like are deviated. Therefore, in the pixels 100 and the like arranged in a periphery of the pixel array unit 10, the on-chip lenses 110 and the like are arranged so as to be shifted from centers of the pixels 100 according to the incident angle of the incident light components, so that the deviation of the condensing positions is corrected. Such correction in which the on-chip lenses are deviated according to the incident angle of the incident light components is called pupil correction.

[Configuration of On-Chip Lens in Vicinity of Left End of Pixel Array Unit]

Figure 12:
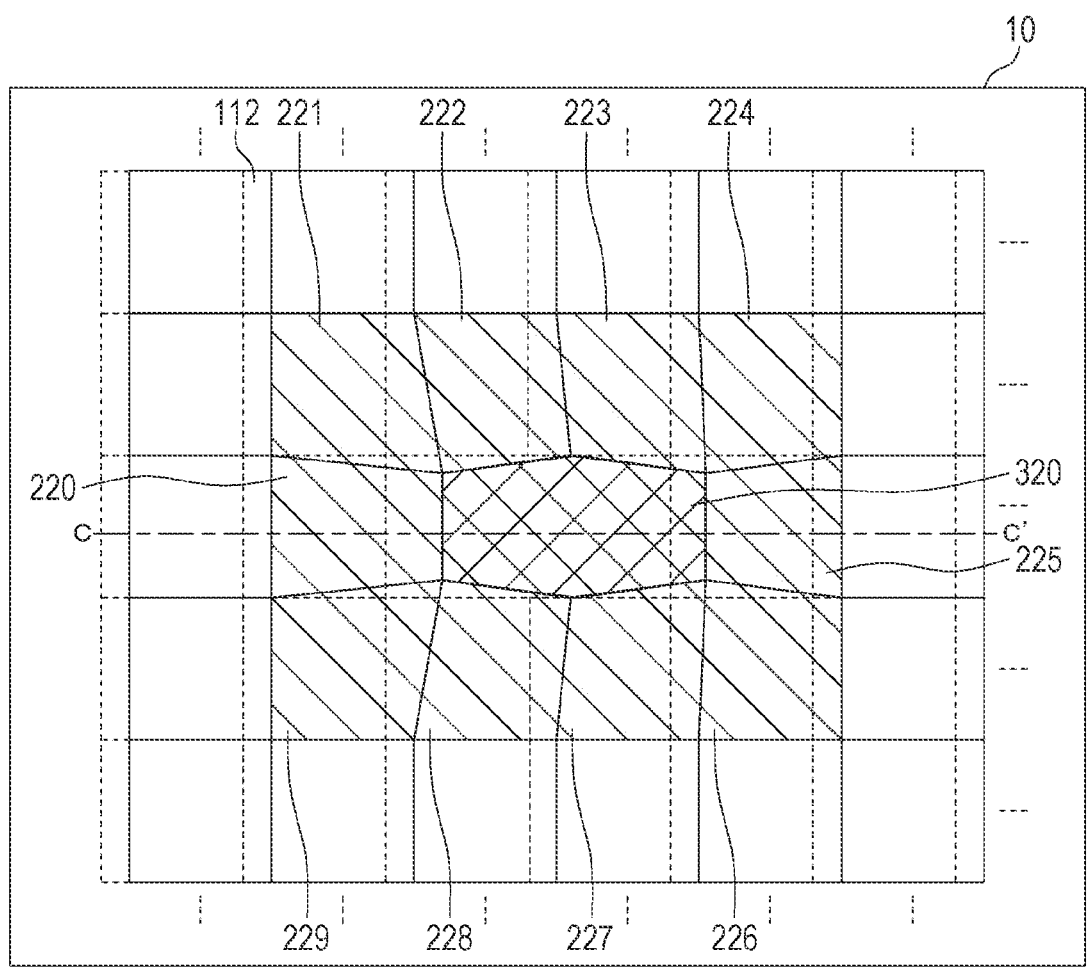
FIG. 12 is a diagram illustrating a configuration example of on-chip lenses according to a second embodiment of the present disclosure.

FIG. 12 is a diagram illustrating a configuration example of the on-chip lenses according to the second embodiment of the present disclosure. FIG. 12 illustrates a configuration example of on-chip lenses 110 and the like of pixels 100 and the like arranged in the vicinity of a left end side, among the pixels 100 and the like arranged on a periphery of the pixel array unit 10 described with reference to FIG. 1. The pixel array unit 10 in FIG. 12 is different from the pixel array unit 10 described with reference to FIG. 2 in the following points. The pixels 100 in FIG. 12 include on-chip lenses 112 instead of the on-chip lenses 110. Phase difference pixel adjacent pixels 200 in FIG. 12 include adjacent on-chip lenses 220 to 229 instead of the adjacent on-chip lenses 210 to 219. Phase difference pixels 300 in FIG. 12 include a common on-chip lens 320 instead of the common on-chip lens 310.

The on-chip lenses 112, the adjacent on-chip lenses 220 to 229, and the common on-chip lens 320 in FIG. 12 are arranged so that the on-chip lenses 110 and the like are shifted from the centers of the pixels 100 and the like according to the incident angle of the incident light components. Specifically, the on-chip lenses 112, the adjacent on-chip lenses 220 to 229, and the common on-chip lens 320 are arranged so as to be shifted to a right direction, which is a direction of the optical center of the pixel array unit 10. Furthermore, among the adjacent on-chip lenses 220 to 229, the adjacent on-chip lenses 224 to 226 close to the optical center of the pixel array unit 10 and the adjacent on-chip lenses 220, 221, and 229 close to the end portion of the pixel array unit 10 are formed to have different sizes. For example, the adjacent on-chip lenses 224 to 226 are formed to have sizes smaller than the adjacent on-chip lenses 220, 221, and 229 arranged symmetrically with respect to the common on-chip lens 320. Specifically, the adjacent on-chip lens 224 is formed to have a size smaller than the adjacent on-chip lens 229. Similarly, the adjacent on-chip lens 225 is formed to have a size smaller than the adjacent on-chip lens 220, and the adjacent on-chip lens 226 is formed to have a size smaller than the adjacent on-chip lens 221.

Note that the common on-chip lens 320 is an example of a peripheral common on-chip lens described in the claims. Each of the adjacent on-chip lenses 220 to 229 is an example of a peripheral adjacent on-chip lens described in the claims. Note that each of the on-chip lenses 112 is an example of the individual on-chip lens described in the claims.

Furthermore, the adjacent on-chip lens 225 arranged between the common on-chip lens 320 and the optical center of the pixel array unit 10 is formed to have a size smaller than the adjacent on-chip lens 220 arranged symmetrically with respect to the common on-chip lens 320. Furthermore, the adjacent on-chip lens 225 is formed to have a size smaller than an on-chip lens 112 adjacent to the adjacent on-chip lens 225. Furthermore, the adjacent on-chip lens 220 is formed to have a size larger than an on-chip lens 112 adjacent to the adjacent on-chip lens 220. Note that the adjacent on-chip lens 225 is an example of a peripheral close-adjacent on-chip lens described in the claims. The adjacent on-chip lens 220 is an example of a peripheral far-adjacent on-chip lens described in the claims.

As described above, among the adjacent on-chip lenses 220 to 229, the adjacent on-chip lens arranged near the optical center of the pixel array unit 10 is formed to have a size smaller than the adjacent on-chip lens arranged near the end portion of the pixel array unit 10. In particular, the adjacent on-chip lens 225 arranged between the common on-chip lens 320 and the optical center of the pixel array unit 10 is formed to have the smallest size, and is formed to have a size smaller than the on-chip lens 112 adjacent to the adjacent on-chip lens 225 and the adjacent on-chip lens 220 arranged in an opposite position. As described above, the adjacent on-chip lenses 220 to 229 are adjusted to have asymmetrical shapes. This adjustment is performed to level the sensitivity of the adjacent on-chip lenses 220 to 229 to the incident light components.

As described above, the adjacent on-chip lenses 220 to 229 are arranged so as to be shifted in the direction of the optical center of the pixel array unit 10 for the pupil correction. At this time, if the adjacent on-chip lenses 220 to 229 have shapes similar to the adjacent on-chip lenses 210 to 219 described with reference to FIG. 2, the adjacent on-chip lens arranged near the optical center of the pixel array unit 10 and the adjacent on-chip lens arranged near the end portion of the pixel array unit 10 have different sensitivity characteristics. For example, the adjacent on-chip lens 225 without the above-described adjustment has higher sensitivity than the adjacent on-chip lens 220 without the adjustment either. This is because the adjacent on-chip lenses are formed so as to overhang regions of the phase difference pixels 300, and thus, an effect of the pupil correction differs depending on a position relative to the common on-chip lens 320. Furthermore, as described with reference to FIG. 3, the adjacent on-chip lenses have different depths between end portions adjacent to the common on-chip lens 320 and end portions adjacent to the on-chip lenses 112, which causes the effect of the pupil correction to differ.

Therefore, the sensitivity can be leveled by the adjustment of the shape as in the adjacent on-chip lenses 220 to 229 described above. Note that, in the vicinity of a right end of the pixel array unit 10, on-chip lenses and the like having shapes in which the on-chip lenses 112 and the like in FIG. 12 are laterally inverted can be used. If the shapes and the positions of the resists 403 and 404 described with reference to FIG. 9 are changed, the common on-chip lens 320 and the adjacent on-chip lenses 220 to 229 can be formed.

Figure 13:
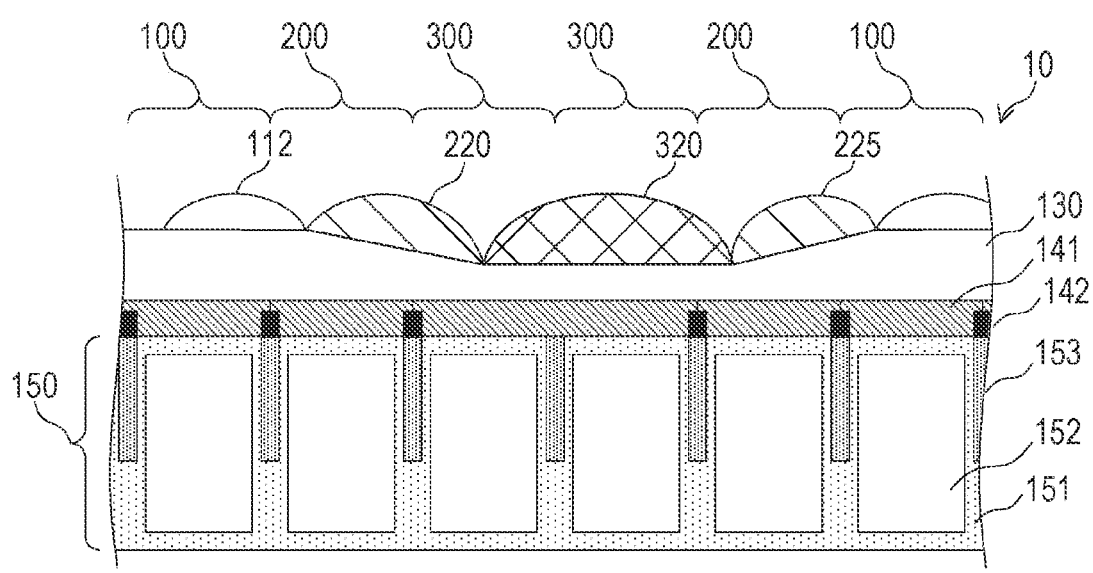
FIG. 13 is a cross-sectional view illustrating a configuration example of an imaging element according to the second embodiment of the present disclosure.

FIG. 13 is a cross-sectional view illustrating a configuration example of the imaging element according to the second embodiment of the present disclosure. FIG. 13 is a cross-sectional view illustrating a configuration of a cross section of the imaging element 1 along a line C-C' in FIG. 12. As illustrated in FIG. 13, the adjacent on-chip lenses 220 and 225 are formed to have different shapes.

[Configuration of On-Chip Lens in Vicinity of Upper End of Pixel Array Unit]

Figure 14:
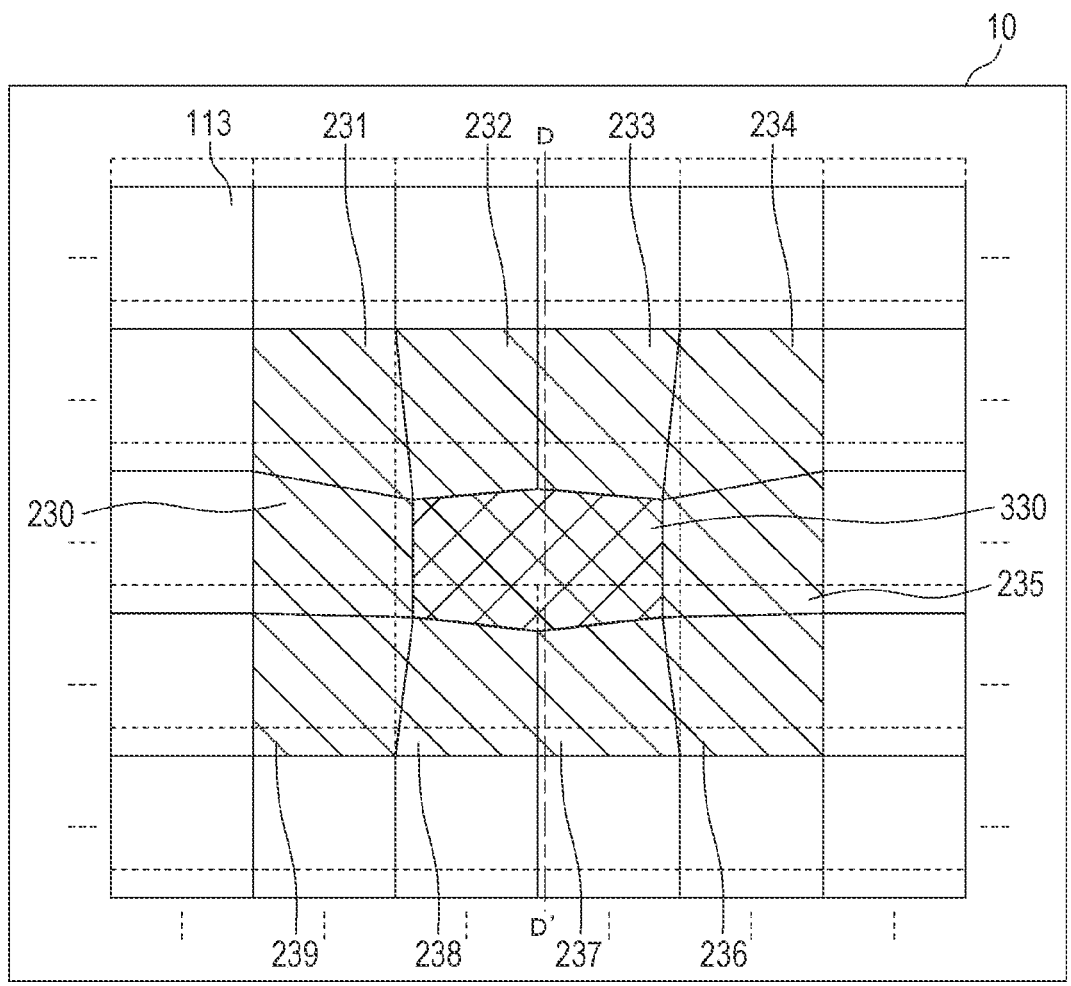
FIG. 14 is a diagram illustrating a configuration example of the on-chip lenses according to the second embodiment of the present disclosure.

FIG. 14 is a diagram illustrating a configuration example of the on-chip lenses according to the second embodiment of the present disclosure. FIG. 14 illustrates a configuration example of on-chip lenses of pixels 100 and the like arranged in the vicinity of an upper end side, among the pixels 100 and the like arranged on the periphery of the pixel array unit 10 described with reference to FIG. 1. The pixel array unit 10 in FIG. 14 is different from the pixel array unit 10 described with reference to FIG. 2 in the following points. The pixels 100 in FIG. 14 include on-chip lenses 113 instead of the on-chip lenses 110. The phase difference pixel adjacent pixels 200 in FIG. 14 include adjacent on-chip lenses 230 to 239 instead of the adjacent on-chip lenses 210 to 219. The phase difference pixels 300 in FIG. 14 include a common on-chip lens 330 instead of the common on-chip lens 310.

The on-chip lenses 113, the adjacent on-chip lenses 230 to 239, and the common on-chip lens 330 in FIG. 14 are arranged so as to be shifted to a downward direction, which is the direction of the optical center of the pixel array unit 10. Furthermore, among the adjacent on-chip lenses 230 to 239, the adjacent on-chip lenses 236 to 239 close to the optical center of the pixel array unit 10 and the adjacent on-chip lenses 231 to 234 close to the end portion of the pixel array unit 10 are formed to have different sizes. For example, the adjacent on-chip lenses 236 to 239 are formed to have sizes smaller than the adjacent on-chip lenses 231 to 234 arranged symmetrically with respect to the common on-chip lens 330. Specifically, the adjacent on-chip lenses 236 and 239 are formed to have sizes smaller than the adjacent on-chip lenses 231 and 234, respectively. Similarly, the adjacent on-chip lenses 237 and 238 are formed to have sizes smaller than the adjacent on-chip lenses 232 and 233, respectively.

Note that the common on-chip lens 330 is an example of the peripheral common on-chip lens described in the claims. Each of the adjacent on-chip lenses 230 to 239 is an example of the peripheral adjacent on-chip lens described in the claims. Note that each of the on-chip lenses 113 is an example of the individual on-chip lens described in the claims.

Furthermore, the adjacent on-chip lenses 237 and 238 arranged between the common on-chip lens 330 and the optical center of the pixel array unit 10 are formed to have sizes smaller than the adjacent on-chip lenses 232 and 233 each arranged symmetrically with respect to the common on-chip lens 330. Furthermore, the adjacent on-chip lenses 237 and 238 are formed to have sizes smaller than on-chip lenses 113 adjacent to the adjacent on-chip lenses 237 and 238. In addition, the adjacent on-chip lenses 232 and 233 are formed to have sizes larger than on-chip lenses 113 adjacent to the adjacent on-chip lenses 232 and 233. Note that each of the adjacent on-chip lenses 237 and 238 is an example of the peripheral close-adjacent on-chip lens described in the claims. Each of the adjacent on-chip lenses 232 and 233 is an example of the peripheral far-adjacent on-chip lens described in the claims.

As described above, among the adjacent on-chip lenses 230 to 239, the adjacent on-chip lens arranged near the optical center of the pixel array unit 10 is formed to have a size smaller than the adjacent on-chip lens arranged near the end portion of the pixel array unit 10. The adjacent on-chip lenses 237 and 238 arranged between the common on-chip lens 330 and the optical center of the pixel array unit 10 are formed to have the smallest sizes, and are formed to have sizes smaller than the on-chip lenses 113 adjacent to the adjacent on-chip lenses 237 and 238 and the adjacent on-chip lenses 232 and 233 in opposite positions. Similarly to the adjacent on-chip lenses 220 to 229 described with reference to FIG. 12, the adjacent on-chip lenses 230 to 239 are formed to have asymmetrical shapes, so that the sensitivity of the adjacent on-chip lenses 230 to 239 to the incident light components can be leveled. Note that, in the vicinity of a lower end of the pixel array unit 10, on-chip lenses and the like having shapes in which the on-chip lenses 113 and the like in FIG. 14 are inverted upside down can be used.

Figure 15:
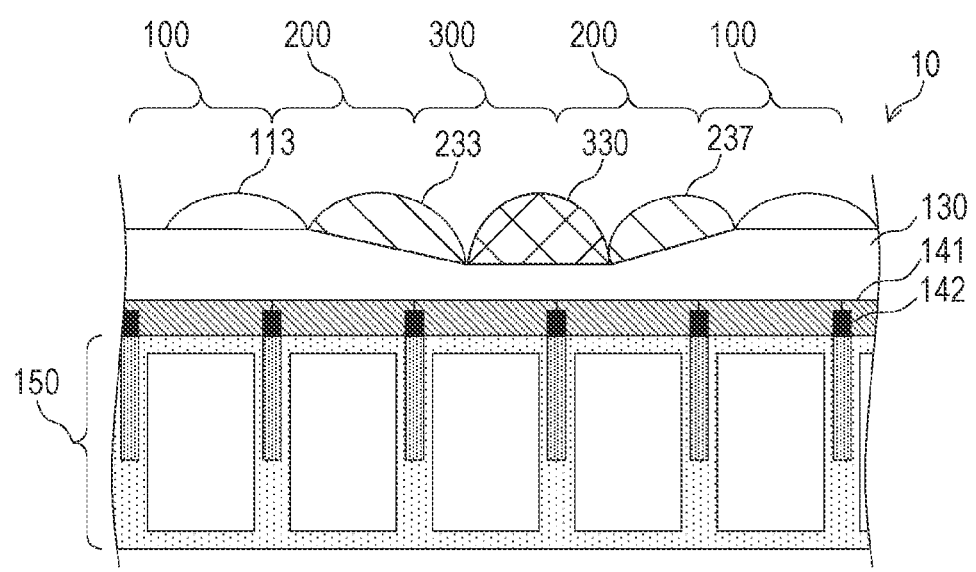
FIG. 15 is a cross-sectional view illustrating a configuration example of the imaging element according to the second embodiment of the present disclosure.

FIG. 15 is a cross-sectional view illustrating a configuration example of the imaging element according to the second embodiment of the present disclosure. FIG. 15 is a cross-sectional view illustrating a configuration of a cross section of the imaging element 1 along a line D-D' in FIG. 14. As illustrated in FIG. 15, the adjacent on-chip lenses 233 and 237 are formed to have different shapes.

[Configuration of On-Chip Lens in Vicinity of Upper Left Corner of Pixel Array Unit]

Figure 16:
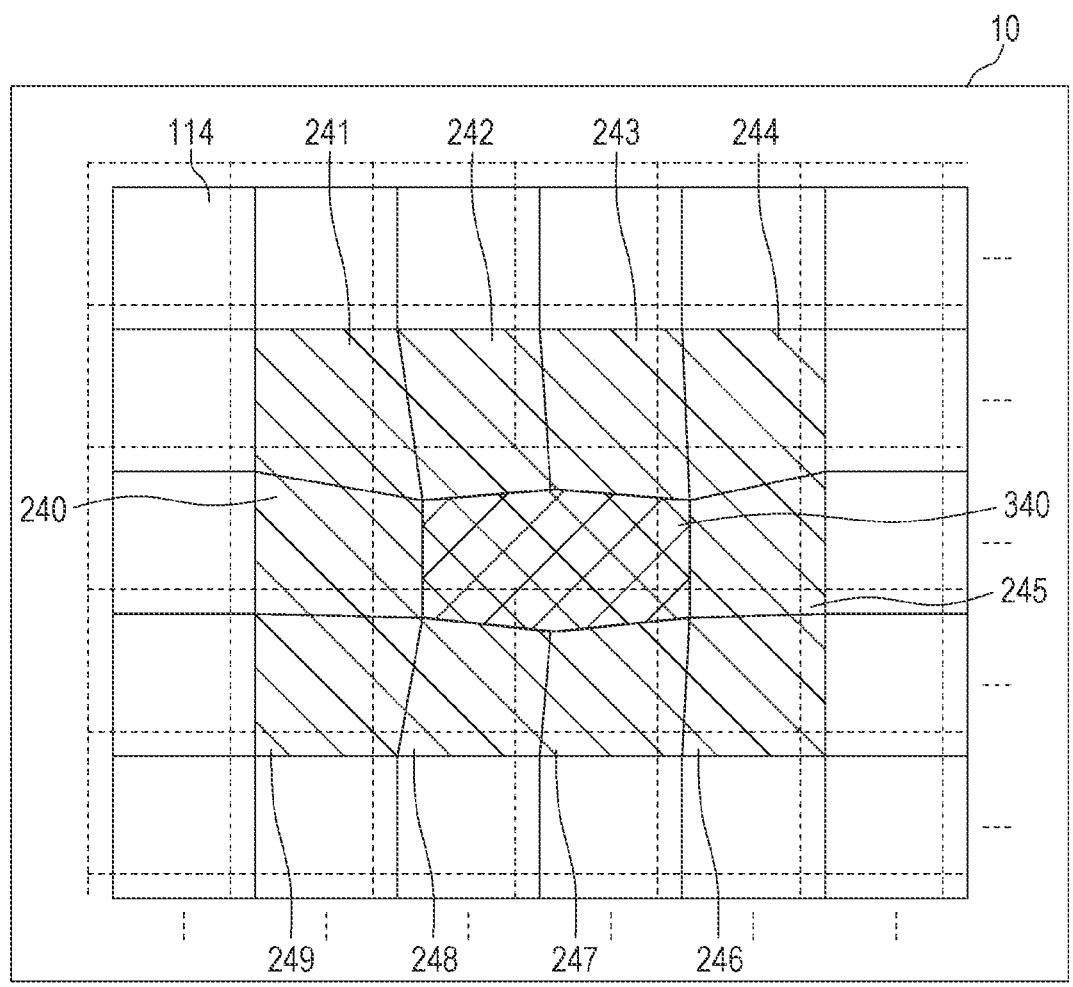
FIG. 16 is a diagram illustrating a configuration example of the on-chip lenses according to the second embodiment of the present disclosure.

FIG. 16 is a diagram illustrating a configuration example of the on-chip lenses according to the second embodiment of the present disclosure. FIG. 16 illustrates a configuration example of on-chip lenses of pixels 100 and the like arranged in the vicinity of an upper left corner, among the pixels 100 and the like arranged on the periphery of the pixel array unit 10 described with reference to FIG. 1. The pixel array unit 10 in FIG. 16 is different from the pixel array unit 10 described with reference to FIG. 2 in the following points. The pixels 100 in FIG. 16 include on-chip lenses 114 instead of the on-chip lenses 110. The phase difference pixel adjacent pixels 200 in FIG. 16 include adjacent on-chip lenses 240 to 249 instead of the adjacent on-chip lenses 210 to 219. The phase difference pixels 300 in FIG. 16 include a common on-chip lens 340 instead of the common on-chip lens 310.

The on-chip lenses 114, the adjacent on-chip lenses 240 to 249, and the common on-chip lens 340 in FIG. 16 are arranged so as to be shifted to a lower right direction, which is the direction of the optical center of the pixel array unit 10. Furthermore, among the adjacent on-chip lenses 240 to 249, the adjacent on-chip lenses 245 to 247 close to the optical center of the pixel array unit 10 and the adjacent on-chip lenses 240 to 242 close to the end portion of the pixel array unit 10 are formed to have different sizes. For example, the adjacent on-chip lenses 245 to 247 are formed to have sizes smaller than the adjacent on-chip lenses 240 to 242 arranged symmetrically with respect to the common on-chip lens 340. Specifically, the adjacent on-chip lenses 245 is formed to have a size smaller than the adjacent on-chip lens 240. Similarly, the adjacent on-chip lens 246 is formed to have a size smaller than the adjacent on-chip lens 241. The adjacent on-chip lens 247 is formed to have a size smaller than the adjacent on-chip lens 242.

Note that the common on-chip lens 340 is an example of the peripheral common on-chip lens described in the claims. Each of the adjacent on-chip lenses 240 to 249 is an example of the peripheral adjacent on-chip lens described in the claims. Note that each of the on-chip lenses 114 is an example of the individual on-chip lens described in the claims.

Furthermore, the adjacent on-chip lens 246 arranged between the common on-chip lens 340 and the optical center of the pixel array unit 10 is formed to have a size smaller than the adjacent on-chip lens 241 arranged symmetrically with respect to the common on-chip lens 340. Furthermore, the adjacent on-chip lens 246 is formed to have a size smaller than an on-chip lens 114 adjacent to the adjacent on-chip lens 246. Furthermore, the adjacent on-chip lens 241 is formed to have a size larger than an on-chip lens 114 adjacent to the adjacent on-chip lens 241. Note that the adjacent on-chip lens 246 is an example of the peripheral close-adjacent on-chip lens described in the claims. The adjacent on-chip lens 241 is an example of the peripheral far-adjacent on-chip lens described in the claims.

As described above, among the adjacent on-chip lenses 240 to 249, the adjacent on-chip lens arranged near the optical center of the pixel array unit 10 is formed to have a size smaller than the adjacent on-chip lens arranged near the end portion of the pixel array unit 10. The adjacent on-chip lens 246 arranged between the common on-chip lens 340 and the optical center of the pixel array unit 10 is formed to have the smallest size, and is formed to have a size smaller than the on-chip lens 114 adjacent to the adjacent on-chip lens 246 and the adjacent on-chip lens 241 in an opposite position. Similarly to the adjacent on-chip lenses 220 to 229 described with reference to FIG. 12, the adjacent on-chip lenses 240 to 249 are formed to have asymmetrical shapes, so that the sensitivity to the incident light components can be leveled. Note that, in a corner portion of the pixel array unit 10 other than the vicinity of the upper left corner, on-chip lenses and the like having shapes in which the on-chip lenses 114 and the like in FIG. 16 are symmetrically inverted can be used.

Since other configurations of the imaging element 1 are similar to the configurations of the imaging element 1 described in the first embodiment of the present disclosure, the description thereof will be omitted.

As described above, in the imaging element 1 of the second embodiment of the present disclosure, in a case where the pupil correction is performed, the shapes of the common on-chip lens and the adjacent on-chip lenses are adjusted, so that the sensitivity of the adjacent on-chip lenses can be leveled. As a result, deterioration of image quality can be prevented.

<3. Third Embodiment>

In the imaging element 1 of the above-described first embodiment, the adjacent on-chip lenses 210 to 219 are formed to have sizes larger than the on-chip lenses 110. On the other hand, an imaging element 1 of a third embodiment of the present disclosure is different from the above-described first embodiment in that a part of the adjacent on-chip lenses 210 to 219 is formed to have a size larger than the on-chip lenses 110.

[Configuration of On-Chip Lens]

Figure 17:
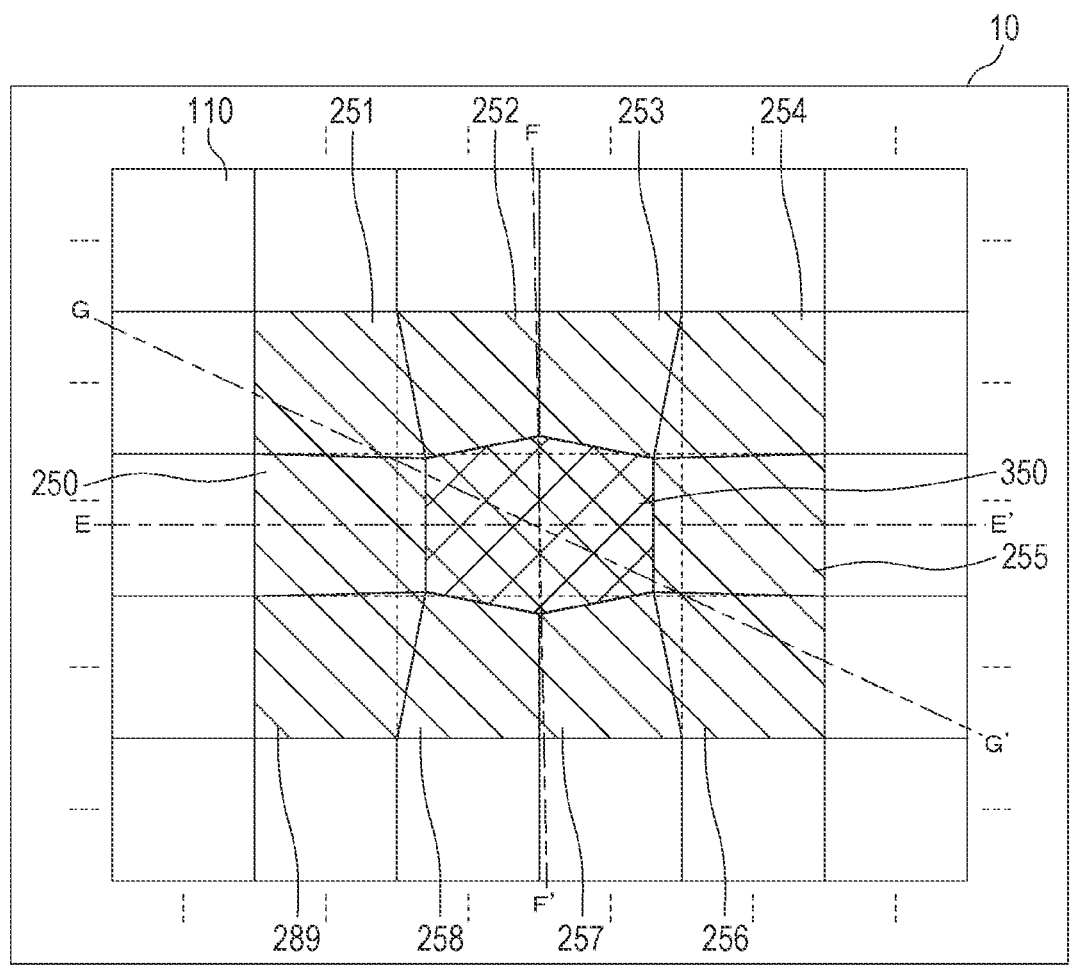
FIG. 17 is a diagram illustrating a configuration example of on-chip lenses according to a third embodiment of the present disclosure.

FIG. 17 is a diagram illustrating a configuration example of on-chip lenses according to the third embodiment of the present disclosure. A pixel array unit 10 in FIG. 17 is different from the pixel array unit 10 described with reference to FIG. 2 in the following points. Phase difference pixel adjacent pixels 200 in FIG. 17 include adjacent on-chip lenses 250 to 259 instead of the adjacent on-chip lenses 210 to 219. Phase difference pixels 300 in FIG. 17 include a common on-chip lens 350 instead of the common on-chip lens 310.

Similarly to the adjacent on-chip lenses 210 to 219 described with reference to FIG. 2, the adjacent on-chip lenses 250 to 259 in FIG. 17 are formed to have sizes different from the on-chip lenses 110. Meanwhile, the common on-chip lens 350 is formed as a hexagon in which sides corresponding to long sides of a rectangular shape formed with the two phase difference pixels 300 are shortened, and sides corresponding to short sides of the rectangular shape are lengthened, as compared with the common on-chip lens 310 described with reference to FIG. 2. Therefore, in the common on-chip lens 350, a shape of a bottom surface can be formed as a shape close to a circle, and the separation accuracy of pupil division can be improved. Such a shape of the common on-chip lens 350 can be formed if the adjacent on-chip lenses 252, 253, 257, and 258 are formed to have sizes smaller than the on-chip lenses 110.

Since the adjacent on-chip lenses 250, 251, 254 to 256, and 259 are formed to have sizes larger than the on-chip lenses 110, similarly to the adjacent on-chip lens 210 and the like in FIG. 2, the adjacent on-chip lenses 250, 251, 254 to 256, and 259 are formed so as to overhang regions of the phase difference pixels 300. On the other hand, since the adjacent on-chip lenses 252, 253, 257, and 258 are formed to have smaller sizes, the common on-chip lens 350 is formed so as to overhang regions of the phase difference pixel adjacent pixels 200 corresponding to these adjacent on-chip lenses. Therefore, the shape of the bottom surface of the common on-chip lens 350 can be approximated to a circular shape.

[Configuration of Imaging Element]

Figure 18A:
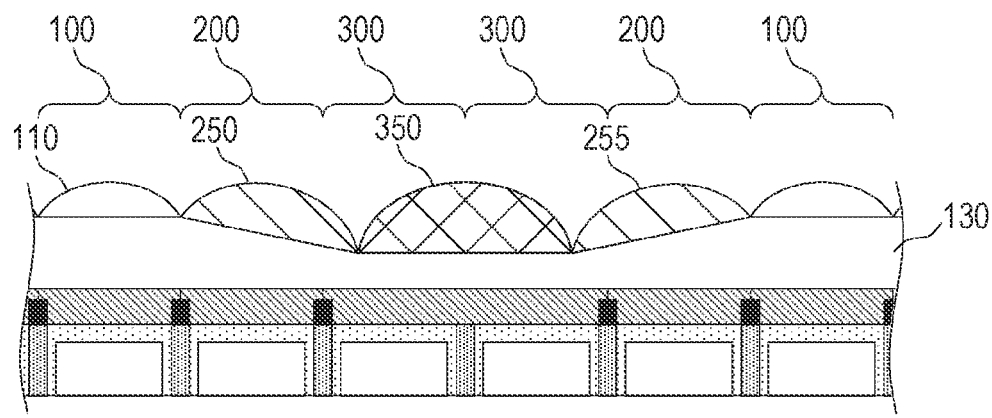
FIGS. 18A, 18B, and 18C are cross-sectional views illustrating a configuration example of an imaging element according to the third embodiment of the present disclosure.
Figure 18B:
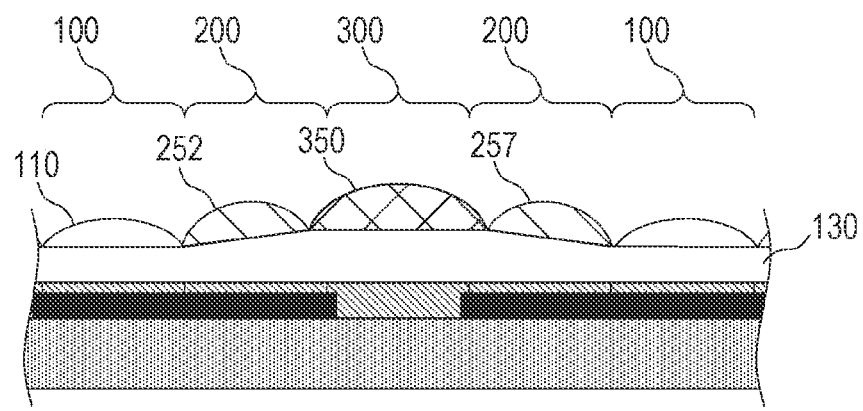
Figure 18C:
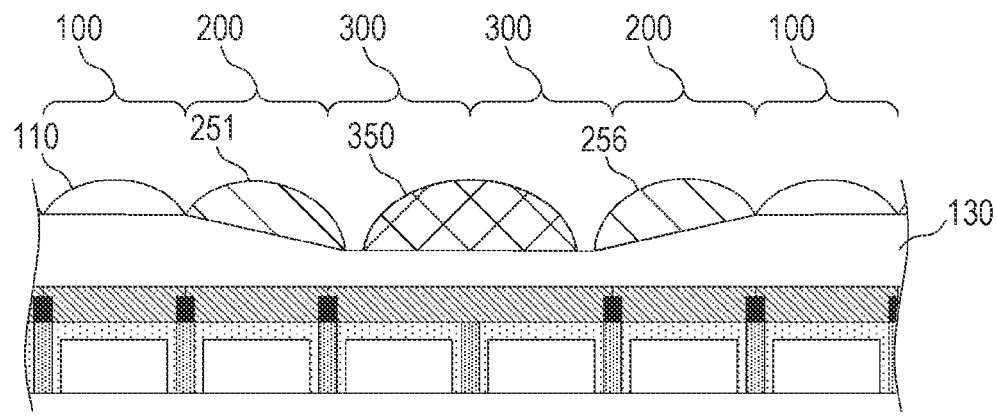

FIGS. 18A, 18B, and 18C are cross-sectional views illustrating a configuration example of the imaging element according to the third embodiment of the present disclosure. FIG. 18A is a cross-sectional view illustrating a configuration of a cross section of the imaging element 1 along a line E-E' in FIG. 17. In FIG. 18A, the adjacent on-chip lenses 250 and 255 are formed to have sizes larger than the on-chip lenses 110. Furthermore, FIG. 18B is a cross-sectional view illustrating a configuration of a cross section of the imaging element along a line F-F' in FIG. 17. In FIG. 18B, the adjacent on-chip lenses 252 and 257 are formed to have sizes smaller than the on-chip lenses 110.

Furthermore, FIG. 18C is a cross-sectional view illustrating a configuration of a cross section of the imaging element along a line G-G' in FIG. 17, and illustrates a configuration of a cross section of the common on-chip lens 350 in an oblique direction. As described above, since the adjacent on-chip lenses 252 and 257 are formed to have sizes smaller than the on-chip lenses 110, the common on-chip lens 350 overhangs the regions of the phase difference pixel adjacent pixels 200. As illustrated in FIG. 18C, the common on-chip lens 350 and the adjacent on-chip lenses 251 and 256 are formed to have shapes in which end portions of the common on-chip lens 350 and the adjacent on-chip lenses 251 and 256 do not come into contact with each other. By adjusting the shapes of the adjacent on-chip lenses 250 to 259 in this way, it is possible to approximate the shape of the bottom surface of the common on-chip lens 350 to a circular shape.

Since other configurations of the imaging element 1 are similar to the configurations of the imaging element 1 described in the first embodiment of the present disclosure, the description thereof will be omitted.

As described above, in the imaging element 1 of the third embodiment of the present disclosure, a part of the adjacent on-chip lenses 250 to 259 is formed to have sizes larger than the on-chip lenses 110, and the other adjacent on-chip lenses are formed to have sizes smaller than the on-chip lenses 110. As a result, the shape of the common on-chip lens 350 is adjusted, so that the separation accuracy of the pupil-divided phase difference pixels 300 can be improved, and the focus detection accuracy can be improved.

<4. Application Example to Camera>

The technology according to the present disclosure (the present technology) can be applied to various products. For example, the present technology may be implemented as an imaging element mounted in an imaging device such as a camera.

Figure 19:
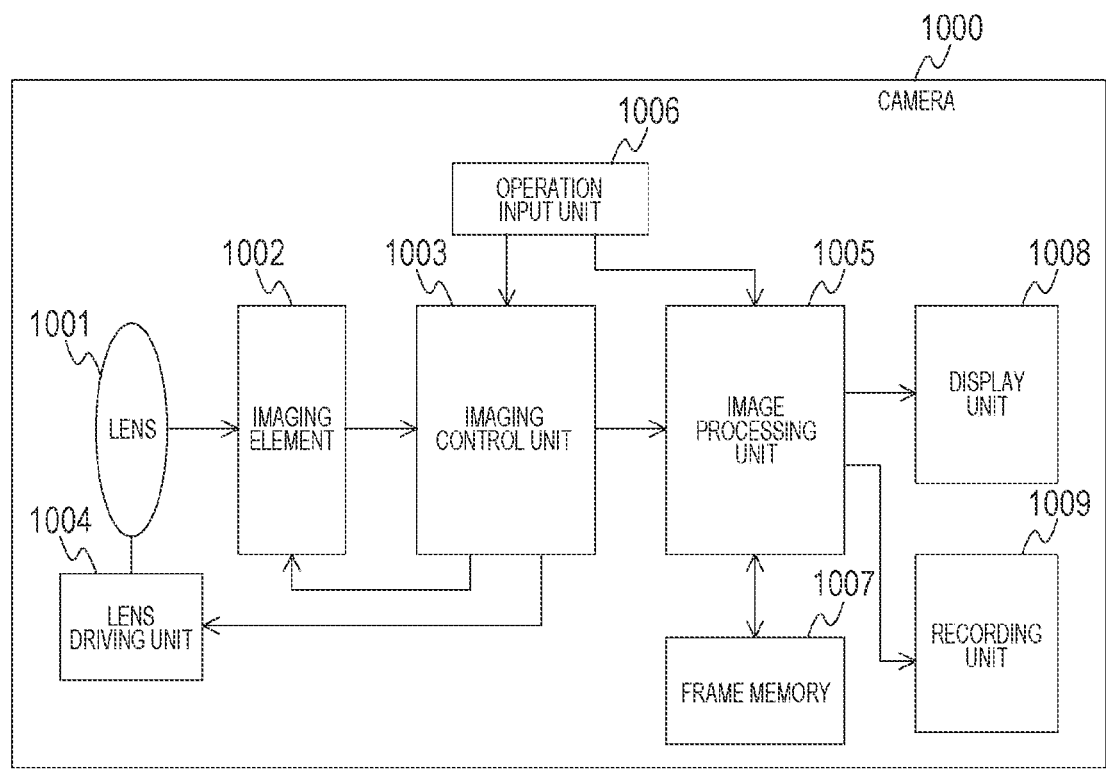
FIG. 19 is a block diagram illustrating a schematic configuration example of a camera that is an example of an imaging device to which the present disclosure can be applied.

FIG. 19 is a block diagram illustrating a schematic configuration example of a camera that is an example of an imaging device to which the present technology can be applied. A camera 1000 in FIG. 19 includes a lens 1001, an imaging element 1002, an imaging control unit 1003, a lens driving unit 1004, an image processing unit 1005, an operation input unit 1006, a frame memory 1007, a display unit 1008, and a recording unit 1009.

The lens 1001 is an imaging lens of the camera 1000. The lens 1001 condenses light components from a subject and makes the light components incident on the imaging element 1002 described later to form an image of the subject.

The imaging element 1002 is a semiconductor element that images the light components from the subject, which are condensed by the lens 1001. The imaging element 1002 generates an analog image signal according to an applied light component, converts the analog image signal into a digital image signal, and outputs the digital image signal.

The imaging control unit 1003 controls imaging by the imaging element 1002. The imaging control unit 1003 generates a control signal and outputs the control signal to the imaging element 1002 to control the imaging element 1002. Furthermore, the imaging control unit 1003 can perform autofocus in the camera 1000 on the basis of the image signal output from the imaging element 1002. Here, the autofocus is a system that detects a focal position of the lens 1001 and automatically adjusts a position of the lens 1001. As this autofocus, a method can be used in which an image plane phase difference is detected by phase difference pixels arranged in the imaging element 1002, so that the focal position is detected (image plane phase difference autofocus). Furthermore, it is also possible to apply a method of detecting, as the focal position, a position where a contrast of an image is the highest (contrast autofocus). The imaging control unit 1003 adjusts the position of the lens 1001 via the lens driving unit 1004 on the basis of the detected focal position, to perform the autofocus. Note that the imaging control unit 1003 can be configured by, for example, a digital signal processor (DSP) equipped with firmware.

The lens driving unit 1004 drives the lens 1001 under the control of the imaging control unit 1003. The lens driving unit 1004 can drive the lens 1001 by changing the position of the lens 1001 using a built-in motor.

The image processing unit 1005 processes the image signal generated by the imaging element 1002. This processing corresponds to, for example, demosaicing for generating image signals of insufficient colors among image signals corresponding to red, green, and blue for each pixel, noise reduction for removing noise of the image signals, encoding of the image signals, and the like. The image processing unit 1005 can be configured by, for example, a microcomputer equipped with firmware.

The operation input unit 1006 receives an operation input from a user of the camera 1000. For the operation input unit 1006, for example, a push button or a touch panel can be used. The operation input received by the operation input unit 1006 is transmitted to the imaging control unit 1003 and the image processing unit 1005. After that, processing according to the operation input such as processing of imaging the subject is started, for example.

The frame memory 1007 is a memory that stores a frame that is image signals for one screen. The frame memory 1007 is controlled by the image processing unit 1005 and holds the frame in a process of image processing.

The display unit 1008 displays an image processed by the image processing unit 1005. For the display unit 1008, a liquid crystal panel can be used, for example.

The recording unit 1009 records the image processed by the image processing unit 1005. For the recording unit 1009, a memory card or a hard disk can be used, for example.

The camera to which the present invention can be applied has been described above. The present technology can be applied to the imaging element 1002 among the configurations described above. Specifically, the imaging element 1 described with reference to FIG. 1 can be applied to the imaging element 1002. By applying the imaging element 1 to the imaging element 1002, it is possible to perform autofocus using the phase difference pixels 300 of the imaging element 1.

Note that, although the camera has been described as an example here, the technology according to the present invention may be applied to another device, for example, a monitoring device or the like.

Finally, the description of each of the above-described embodiments is an example of the present disclosure, and the present disclosure is not limited to the above-described embodiments. Therefore, it is needless to say that, besides each of the above-described embodiments, various changes can be made according to the design or the like as long as the changes do not depart from the technical concept according to the present disclosure.

Note that the present technology may have the following configurations.

(1) An imaging element including a pixel array unit in which pixels that perform photoelectric conversion according to incident light components, a plurality of phase difference pixels that is included in the pixels, is arranged adjacent to each other, and detects a phase difference, and phase difference pixel adjacent pixels that are included in the pixels and are adjacent to the phase difference pixels are arranged two-dimensionally, an individual on-chip lens that is arranged for each of the pixels and individually condenses the incident light components on corresponding one of the pixels, a common on-chip lens that is commonly arranged in the plurality of phase difference pixels and commonly condenses the incident light components, and an adjacent on-chip lens that is arranged for each of the phase difference pixel adjacent pixels, individually condenses the incident light components on corresponding one of the phase difference pixel adjacent pixels, and is formed to have a size different from the individual on-chip lens to adjust a shape of the common on-chip lens.

(2) The imaging element according to (1), in which the adjacent on-chip lens is formed to have a size larger than the individual on-chip lens.

(3) The imaging element according to (2), in which the adjacent on-chip lens is formed to have a bottom portion with a width larger than the individual on-chip lens.

(4) The imaging element according to (2), in which an adjacent on-chip lens adjacent to the common on-chip lens at an apex is formed to have a size larger than an adjacent on-chip lens adjacent to the common on-chip lens on a side.

(5) The imaging element according to any of (1) to (4), in which the individual on-chip lens is arranged so that a position relative to corresponding one of the pixels is shifted according to an incident angle of the incident light components, the adjacent on-chip lens is arranged so that a position relative to corresponding one of the phase difference pixel adjacent pixels is shifted according to the incident angle of the incident light components, and the common on-chip lens is arranged so that a position relative to the phase difference pixels is shifted according to the incident angle of the incident light components.

(6) The imaging element according to (5), in which, among peripheral adjacent on-chip lenses that are adjacent on-chip lenses adjacent to a peripheral common on-chip lens which is a common on-chip lens arranged in a periphery of the pixel array unit, a peripheral adjacent on-chip lens close to an optical center of the pixel array unit and a peripheral adjacent on-chip lens close to an end portion of the pixel array unit are formed to have different sizes.

(7) The imaging element according to (6), in which, among the peripheral adjacent on-chip lenses, the peripheral adjacent on-chip lens close to the optical center of the pixel array unit is formed to have a size smaller than the peripheral adjacent on-chip lens close to the end portion of the pixel array unit, which is arranged symmetrically with respect to the peripheral common on-chip lens.

(8) The imaging element according to (6), in which a peripheral close-adjacent on-chip lens that is a peripheral adjacent on-chip lens arranged between the peripheral common on-chip lens and the optical center of the pixel array unit is formed to have a size smaller than a peripheral far-adjacent on-chip lens that is a peripheral adjacent on-chip lens arranged symmetrically with respect to the peripheral common on-chip lens.

(9) The imaging element according to (8), in which the peripheral close-adjacent on-chip lens is formed to have a size smaller than an individual on-chip lens adjacent to the peripheral close-adjacent on-chip lens.

(10) The imaging element according to (8), in which the peripheral far-adjacent on-chip lens is formed to have a size larger than an individual on-chip lens adjacent to the peripheral far-adjacent on-chip lens.

(11) The imaging element according to any of (1) to (10), in which the adjacent on-chip lens is formed at different heights between a bottom portion of a region adjacent to the common on-chip lens and a bottom portion of a region adjacent to the individual on-chip lens.

(12) The imaging element according to any of (1) to (11), in which a shape of a bottom surface of the adjacent on-chip lens is formed as a shape different from a bottom surface of the phase difference pixel adjacent pixels.

(13) The imaging element according to any of (1) to (12), in which the common on-chip lens commonly condenses the incident light components on two of the phase difference pixels.

(14) The imaging element according to any of (1) to (12), in which the common on-chip lens commonly condenses the incident light components on four of the phase difference pixels.

(15) The imaging element according to any of (1) to (14), in which the plurality of phase difference pixels performs pupil division on the incident light components to detect the phase difference.

(16) A method for manufacturing an imaging element, the method including
a step of forming a pixel array unit in which pixels that perform photoelectric conversion according to incident light components, a plurality of phase difference pixels that is included in the pixels, is arranged adjacent to each other, and detects a phase difference, and phase difference pixel adjacent pixels that are included in the pixels and are adjacent to the phase difference pixels are arranged two-dimensionally,
a step of forming an individual on-chip lens that is arranged for each of the pixels and individually condenses the incident light components on corresponding one of the pixels,
a step of forming a common on-chip lens that is commonly arranged in the plurality of phase difference pixels and commonly condenses the incident light components, and
a step of forming an adjacent on-chip lens that is arranged for each of the phase difference pixel adjacent pixels, individually condenses the incident light components on corresponding one of the phase difference pixel adjacent pixels, and is formed to have a size different from the individual on-chip lens to adjust a shape of the common on-chip lens.

REFERENCE SIGNS LIST

1 Imaging element
10 Pixel array unit
100 Pixel
101, 301 End portion
110, 112 to 114 On-chip lens
141 Color filter
142 Light-shielding film
152 Separation portion
154 Separation region
155, 406, 407 Gap
200 Phase difference pixel adjacent pixel
210 to 219 Adjacent on-chip lens
220 to 229 Adjacent on-chip lens
230 to 239 Adjacent on-chip lens
240 to 249 Adjacent on-chip lens
250 to 259 Adjacent on-chip lens
300 Phase difference pixel
310, 320, 330, 340, 350 Common on-chip lens
403 to 405 Resist
1002 Imaging element
1005 Image processing unit

The invention claimed is:

1. An imaging element, comprising:
a pixel array unit in which pixels configured to perform photoelectric conversion according to incident light components, a plurality of phase difference pixels that is included in the pixels and configured to detect a phase difference, and phase difference pixel adjacent pixels that are included in the pixels and are adjacent to the plurality of phase difference pixels are arranged two-dimensionally, wherein a first phase difference pixel of the plurality of phase difference pixels is adjacent to a second phase difference pixel of the plurality of phase difference pixels;
an individual on-chip lens that is arranged for each of the pixels and configured to individually condense the incident light components on corresponding one of the pixels;
a common on-chip lens that is commonly arranged in the plurality of phase difference pixels and configured to commonly condense the incident light components; and
an adjacent on-chip lens that is arranged for each of the phase difference pixel adjacent pixels and configured to individually condense the incident light components on corresponding one of the phase difference pixel adjacent pixels, wherein
the adjacent on-chip lens has a size larger than the individual on-chip lens to adjust a shape of the common on-chip lens, and
the adjacent on-chip lens adjacent to the common on-chip lens at an apex has a size larger than the adjacent on-chip lens adjacent to the common on-chip lens on a side.

2. The imaging element according to claim 1, wherein the adjacent on-chip lens has a bottom portion with a width larger than the individual on-chip lens.

3. The imaging element according to claim 1, wherein
the individual on-chip lens is arranged so that a position relative to the corresponding one of the pixels is shifted according to an incident angle of the incident light components,
the adjacent on-chip lens is arranged so that a position relative to the corresponding one of the phase difference pixel adjacent pixels is shifted according to the incident angle of the incident light components, and
the common on-chip lens is arranged so that a position relative to the plurality of phase difference pixels is shifted according to the incident angle of the incident light components.

4. The imaging element according to claim 3, wherein, among peripheral adjacent on-chip lenses that are adjacent on-chip lenses adjacent to a peripheral common on-chip lens which is a common on-chip lens arranged in a periphery of the pixel array unit, a peripheral adjacent on-chip lens close to an optical center of the pixel array unit and a peripheral adjacent on-chip lens close to an end portion of the pixel array unit have different sizes.

5. The imaging element according to claim 4, wherein, among the peripheral adjacent on-chip lenses, the peripheral adjacent on-chip lens close to the optical center of the pixel array unit has a size smaller than the peripheral adjacent on-chip lens close to the end portion of the pixel array unit, which is arranged symmetrically with respect to the peripheral common on-chip lens.

6. The imaging element according to claim 4, wherein a peripheral close-adjacent on-chip lens that is a peripheral adjacent on-chip lens arranged between the peripheral common on-chip lens and the optical center of the pixel array unit has a size smaller than a peripheral far-adjacent on-chip lens that is a peripheral adjacent on-chip lens arranged symmetrically with respect to the peripheral common on-chip lens.

7. The imaging element according to claim 6, wherein the peripheral close-adjacent on-chip lens has the size smaller than an individual on-chip lens adjacent to the peripheral close-adjacent on-chip lens.

8. The imaging element according to claim 6, wherein the peripheral far-adjacent on-chip lens has a size larger than an individual on-chip lens adjacent to the peripheral far-adjacent on-chip lens.

9. The imaging element according to claim 1, wherein the adjacent on-chip lens is at different heights between a bottom portion of a region adjacent to the common on-chip lens and a bottom portion of a region adjacent to the individual on-chip lens.

10. The imaging element according to claim 1, wherein a shape of a bottom surface of the adjacent on-chip lens has a shape different from a bottom surface of the phase difference pixel adjacent pixels.

11. The imaging element according to claim 1, wherein the common on-chip lens is further configured to commonly condense the incident light components on two phase difference pixels of the plurality of phase difference pixels.

12. The imaging element according to claim 1, wherein the common on-chip lens is further configured to commonly condense the incident light components on four phase difference pixels of the plurality of phase difference pixels.

13. The imaging element according to claim 1, wherein the plurality of phase difference pixels is further configured to perform pupil division on the incident light components to detect the phase difference.

14. A method for manufacturing an imaging element, the method comprising:
forming a pixel array unit in which pixels that perform photoelectric conversion according to incident light components, a plurality of phase difference pixels that is included in the pixels and detects a phase difference, and phase difference pixel adjacent pixels that are included in the pixels and are adjacent to the phase difference pixels are arranged two-dimensionally, wherein a first phase difference pixel of the plurality of phase difference pixels is adjacent to a second phase difference pixel of the plurality of phase difference pixels;
forming an individual on-chip lens that is arranged for each of the pixels and individually condenses the incident light components on corresponding one of the pixels;
forming a common on-chip lens that is commonly arranged in the plurality of phase difference pixels and commonly condenses the incident light components; and
forming an adjacent on-chip lens that is arranged for each of the phase difference pixel adjacent pixels, individually condenses the incident light components on corresponding one of the phase difference pixel adjacent pixels, and is formed to have a size larger than the individual on-chip lens to adjust a shape of the common on-chip lens, wherein the adjacent on-chip lens adjacent to the common on-chip lens at an apex has a size larger than the adjacent on-chip lens adjacent to the common on-chip lens on a side.

* * * * *